(12) United States Patent
Socha et al.

(10) Patent No.: US 7,506,299 B2
(45) Date of Patent: Mar. 17, 2009

(54) FEATURE OPTIMIZATION USING INTERFERENCE MAPPING LITHOGRAPHY

(75) Inventors: Robert John Socha, Campbell, CA (US); Xuelong Shi, San Jose, CA (US); Douglas Van Den Broeke, Sunnyvale, CA (US); Jang Fung Chen, Cupertino, CA (US)

(73) Assignee: ASML Holding N.V., A.H. Veldhoven (NL)

( * ) Notice: Subject to any disclaimer, the term of this patent is extended or adjusted under 35 U.S.C. 154(b) by 878 days.

(21) Appl. No.: 10/975,342

(22) Filed: Oct. 29, 2004

(65) Prior Publication Data

US 2005/0142470 A1 Jun. 30, 2005

Related U.S. Application Data

(60) Provisional application No. 60/530,656, filed on Dec. 19, 2003.

(51) Int. Cl.
*G06F 17/50* (2006.01)
(52) U.S. Cl. .......................................... 716/19; 716/21
(58) Field of Classification Search ............ 716/19–21; 430/5, 30, 311, 396
See application file for complete search history.

(56) References Cited

U.S. PATENT DOCUMENTS

| | | | |
|---|---|---|---|
| 4,226,527 A * | 10/1980 | Lama et al. | .................... 355/71 |
| 5,229,230 A | 7/1993 | Kamon | |
| 5,895,741 A | 4/1999 | Hasegawa et al. | |
| 6,303,253 B1 | 10/2001 | Lu | |
| 6,355,382 B1 | 3/2002 | Yasuzato et al. | |
| 6,413,684 B1 | 7/2002 | Stanton | |
| 6,519,760 B2 | 2/2003 | Shi et al. | |
| 6,748,409 B1 * | 6/2004 | Toraichi et al. | ............. 708/313 |
| 6,777,141 B2 | 8/2004 | Pierrat | |
| 6,787,271 B2 | 9/2004 | Cote et al. | |
| 6,792,591 B2 | 9/2004 | Shi et al. | |
| 6,807,662 B2 | 10/2004 | Toublan et al. | |
| 2002/0083410 A1 | 6/2002 | Wu et al. | |
| 2002/0157081 A1 | 10/2002 | Shi et al. | |

(Continued)

FOREIGN PATENT DOCUMENTS

EP    0 399 837 A2    11/1990

(Continued)

OTHER PUBLICATIONS

Robert Socha, et al., "Contact Hole Reticle Optimization by Using Interference Mapping Lithography (IML™)," Proceedings of the SPIE, Apr. 14, 2004, pp. 516-534, vol. 5446, No. 1, SPIE.

(Continued)

*Primary Examiner*—Paul Dinh
(74) *Attorney, Agent, or Firm*—Pillsbury Winthrop Shaw Pittman, LLP

(57) ABSTRACT

Disclosed concepts include a method of, and program product for, optimizing an illumination profile of a pattern to be formed in a surface of a substrate relative to a given mask. Steps include mathematically representing resolvable feature(s) from the given mask, generating an interference map representation from the previous step, modifying the interference map representation to maximize intensity corresponding to the resolvable features, and determining assist feature size(s) such that intensity side lobes do not print.

30 Claims, 26 Drawing Sheets

U.S. PATENT DOCUMENTS

| | | |
|---|---|---|
| 2003/0082463 A1 | 5/2003 | Laidig et al. |
| 2003/0228541 A1 | 12/2003 | Hsu et al. |
| 2004/0122636 A1 | 6/2004 | Adam |
| 2004/0209170 A1 | 10/2004 | Broeke et al. |
| 2005/0149900 A1* | 7/2005 | Laidig .................. 716/19 |

FOREIGN PATENT DOCUMENTS

| | | |
|---|---|---|
| EP | 1 237 046 A2 | 9/2002 |
| EP | 1 439 419 A | 7/2004 |
| EP | 1 439 419 A2 | 7/2004 |
| EP | 1 439 420 A | 7/2004 |
| EP | 1 439 420 A1 | 7/2004 |
| WO | WO 02/03140 A1 | 1/2002 |
| WO | WO 03/054626 A1 | 7/2003 |

OTHER PUBLICATIONS

Douglas Van Den Broeke, et al., "Model-based RET using interface maps, algorithms for random contacts at 65 nm," Solid State Technology, Sep. 2004, pp. 63-64, 66, vol. 47, No. 9, Penwell Corporation.

Douglas Van Den Broeke, et al., "Near 0.3 $k_1$ Full Pitch Range Contact Hole Patterning Using Chromeless Phase Lighography (CPL)," Proceedings of the SPIE, Sep. 9, 2003, pp. 297-308, vol. 5256, SPIE.

* cited by examiner

FEATURE OPTIMIZATION USING INTERFERENCE MAPPING LITHOGRAPHY

CLAIM OF PRIORITY

The present invention claims priority from U.S. provisional application No. 60/530,656, and entitled "Extending Interference Mapping to Improve the Depth/Focus and Exposure Latitude," filed Dec. 19, 2003; and from U.S. nonprovisional application Ser. No. 10/756,829, and entitled "Method of Optical Proximity Correction Design for Contact Hole Mask," filed Jan. 14, 2004.

CROSS-REFERENCE TO RELATED APPLICATIONS

This Application relates to U.S. application entitled, "Method of Optical Proximity Correction Design for Contact Hole Mask" (U.S. application Ser. No. 10/756,829, filed Jan. 14, 2004), which is incorporated herein by reference.

FIELD OF THE INVENTION

The present invention relates to photolithography, and in particular to optimizing illumination of an image by maximizing Depth Of Focus and Exposure Latitude.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. Even another goal is to optimize illumination and enhance the contrast of an image on a wafer. Even yet another goal is to increase Depth of Focus (DOF) and Exposure Latitude (EL). However, because of the increasingly microscopic size of lithographic features, such as contact holes, it becomes increasingly difficult to pass light through a corresponding hole on a mask. This in turn lessens the DOF and EL. Conventional techniques to overcome this problem include placing assist features on the substrate so as to increase intensity of the light on the feature being created which also will increase DOF and EL. However, there has yet to be created optimization and model methods for determining the most optimal location of assist features. Rather, assist features are placed after human inspection of test substrates. As such, the correction offered utilizing assist features is often limited by the skill and ability of person/designer responsible for placement of the assist features. There has further yet to be developed a way to optimize assist feature size. This has also been limited to the skill and ability of the person/designer.

The following description discusses novel method and apparatus for performing this method to determine optimal location of scatter bars and other assist features on a substrate surface.

SUMMARY

The disclosed concepts include a method and program product for optimizing an illumination profile of a pattern to be formed in a surface of a substrate relative to a given mask. This is accomplished by mathematically representing resolvable feature(s) from the given mask, generating an interference map representation, modifying the interference map representation to maximize intensity corresponding to the resolvable features, and determining assist feature size(s) such that intensity side lobes do not print. Also, an optimized mask may be created by placing sized assist features on the mask such that the sidelobes do not print.

The step of modifying the interference map includes modifying the interference map representation by replacing it with discrete mask transmissions such that the representation is maximized relative to the center of the resolvable feature(s). Next, discrete mask transmissions are selected such that the representation is minimized for area(s) outside of the resolvable feature(s). This optimizes exposure latitude.

Depth of focus may be maximized as well. The same method is employed, but instead the interference map is modified to minimize the change in peak intensity with respect to focus. This is accomplished by taking a partial derivative with respect to focus; and selecting discrete mask transmission(s) that minimizes the partial derivative.

The foregoing and other features, aspects, and advantages of the present invention will become more apparent from the following detailed description of the present invention when taken in conjunction with the accompanying drawings.

BRIEF DESCRIPTION OF THE DRAWINGS

FIGS. 1($b$)-($c$) show the correlation between the PSF and a binary Fresnel lens and a CPL Fresnel lens, respectively.

FIG. 3($b$) illustrates the interference map corresponding to the pattern illustrated in FIG. 3($a$).

FIG. 4($b$) illustrates the aerial image corresponding to the mask of FIG. 4($a$).

FIG. 6($b$) is a table listing eigenvalues for each eigennumber for an isolated contact hole and for a double contact hole.

FIG. 7A-1 and 7A-2 illustrate a quasar illuminator and a plot of the first eigenfunction for quasar illumination, respectively.

FIG. 7B-1 and 7B-2 illustrates a Cquad illuminator and a plot of the first eigenfunction for Cquad illumination, respectively.

FIG. 7C-1 and 7C-2 illustrates an annular illuminator and a plot of the first eigenfunction for annular illumination, respectively.

FIG. 7D-1 and 7D-2 illustrates a conventional illuminator and a plot of the first eigenfunction for conventional illumination, respectively.

FIG. 10($b$) illustrates an aerial image of an eigenfunction generated for Quasar illumination.

FIG. 10($c$) illustrates an aerial image from convolving the mask representation of FIG. 10($a$) with the aerial image (eigenfunction) of FIG. 10($b$).

FIG. 16($c$) illustrates illustrates an optimized CPL mask generated according to the first and fourth eigenfunctions of FIGS. 16($a$)-($b$).

FIG. 17A-1 illustrates an aerial image of the optimized CPL mask of FIG. 16($c$).

FIG. 17A-2 through 17A-4 illustrate an aerial image of the optimized CPL mask of FIG. 17A-1 plotted for focuses of 0.0 um, 0.1 um and 0.2 um, respectively.

FIG. 17B-1 illustrates an exemplary optimized binary mask.

FIGS. 17B-2 through 17B-4 illustrate an aerial image of the optimized mask of FIG. 17B-1 plotted for focuses of 0.0 um, 0.1 um and 0.2 um, respectively.

FIG. 17($c$) illustrates an exemplary optimized CPL mask of FIG. 16($c$) having odd symmetry.

FIGS. 17C-2 through 17C-4 illustrate an aerial image of the optimized mask of FIG. 17C-1 plotted for focuses of 0.0 um, 0.1 um and 0.2 um, respectively.

DESCRIPTION

Figure 1A:
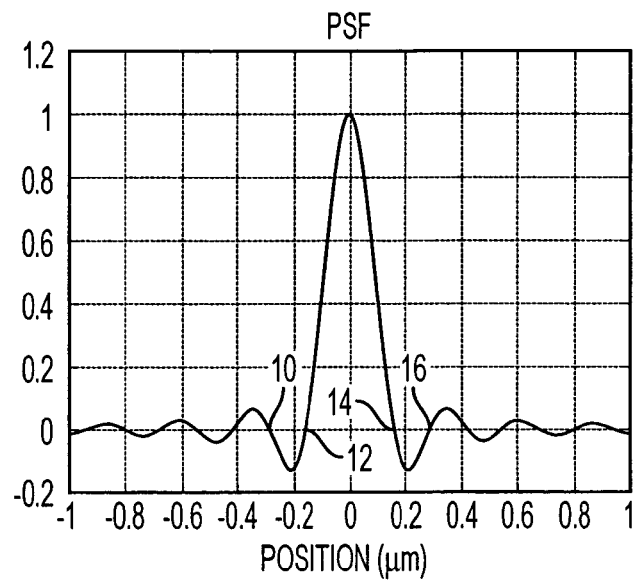
FIG. 1($a$) illustrates a plot of the point spread function (PSF).

In microlithography, one method to increase Depth of Focus and Exposure Latitude, as discussed above, includes strategic placement of assist features on the surface of a substrate in order to focus light intensity on the surface where the feature is to be created. The inventors have developed a novel method, referred generally to as Interference Mapping Lithography ("IML"), for optimizing the placement and sizing of assists on a surface of a substrate in an extremely efficient manner.

Using IML, strategic placement of assist features (AF) around contact holes for a two tone mask, such as a binary mask or an attenuating phase shift mask, may be accomplished for enhancing EL and DOF. For example, on a coherence map which maps changes in coherence values across the image plane of an exposure tool, areas where the intensity is greater than zero represent a location where light will interfere constructively with the desired feature/pattern, while areas where the intensity is less than zero represent a location where light will interfere destructively with the desired feature/pattern. The aerial image of the contact hole can be improved by placing clear assist features (transmission of 100%) where constructive interference occurs in the interference map. The aerial image intensity can be increased further by placing 180° assist features (transmission of −100%) where destructive interference occurs in the interference map; hence creating a CPL mask. In other words, 180° assist features (transmission of −100%) reverse the phase of destructive interference and cause destructive interference areas to contribute constructively to the intensity. This phase reversal of the destructive interference areas causes all areas of the mask to be used constructively which maximizes the intensity for creating the feature/pattern.

To illustrate IML, it is best to investigate imaging with coherent light. For instance, if a pinhole in the reticle is illuminated with a coherent source, the electric field at the wafer may be represented by the point spread function (PSF). A graphical illustration of the point spread function can be seen in FIG. 1a, and represents the resolution capability of the lithography system. Because the projection lens (shown in FIG. 26) band-pass-filters the diffracted light from the pinhole reticle, the PSF is spread out and has some finite resolution. Therefore, for any mask, the electric field at the wafer may be determined by the convolution of the respective mask transmission with the PSF. A binary contact hole with $k_1$ (as defined by the resolution equation $k_1 = pNA/2\lambda$, where p equals pitch, NA equals numerical aperture and $\lambda$ equals exposure wavelength) less than 0.4 is essentially a pinhole in the reticle. From this binary contact hole, the projection lens collects little of the light diffracted by the contact. This loss of light reduces the peak intensity at the wafer. This reduction in peak intensity limits the exposure latitude (EL) and depth of focus (DOF) of the contact hole printing process.

In other fields of optics, a known method in coherent imaging exists for increasing the peak intensity in the image plane from a pinhole in the object plane. In this method, the pinhole on the mask is replaced with a Fresnel lens.

Figure 1B:
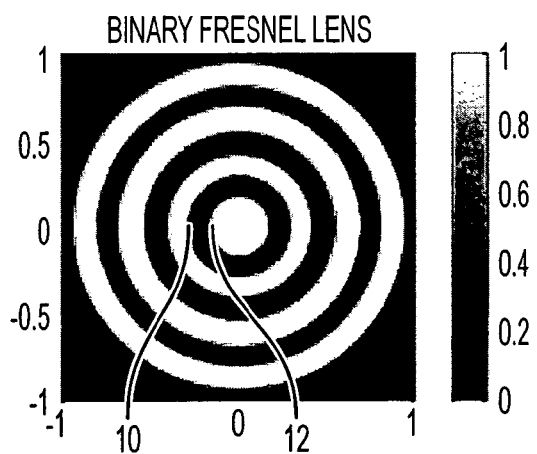
Figure 1C:
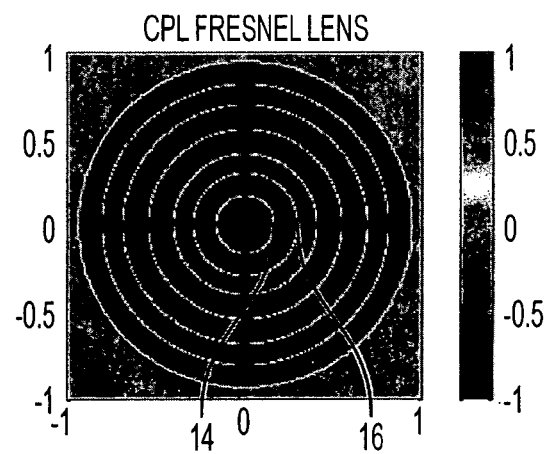

There are two types of Fresnel lenses, a binary mask Fresnel lens (FIG. 1b) and a phase mask Fresnel lens (FIG. 1c). In binary mask type Fresnel lens, there are opaque areas (transmission of 0) and clear areas (transmission of 1). Since the intensity at the wafer is given by the convolution of the mask transmission with the PSF, the intensity at the wafer can be maximized by positioning clear areas on the mask where the PSF is greater than zero and by positioning opaque areas on the mask where the PSF is less than zero. Correlation between the PSF and binary Fresnel lens is shown in FIGS. 1a-1b.

In a phase mask type Fresnel lens (FIG. 1c), there are 100% transmittance 0° areas (transmission of +1) and 100% transmittance 180° areas (transmission of −1). The intensity at the wafer with a phase Fresnel lens can further increase the peak intensity as compared to the binary Fresnel lens. This is accomplished by placing 180° areas where the PSF is less than zero and placing 0° areas where the PSF is greater than zero, i.e., the mask is a chromeless mask. Correlation between the PSF and CPL Fresnel lens is shown in FIGS. 1a and 1c.

Figure 2:
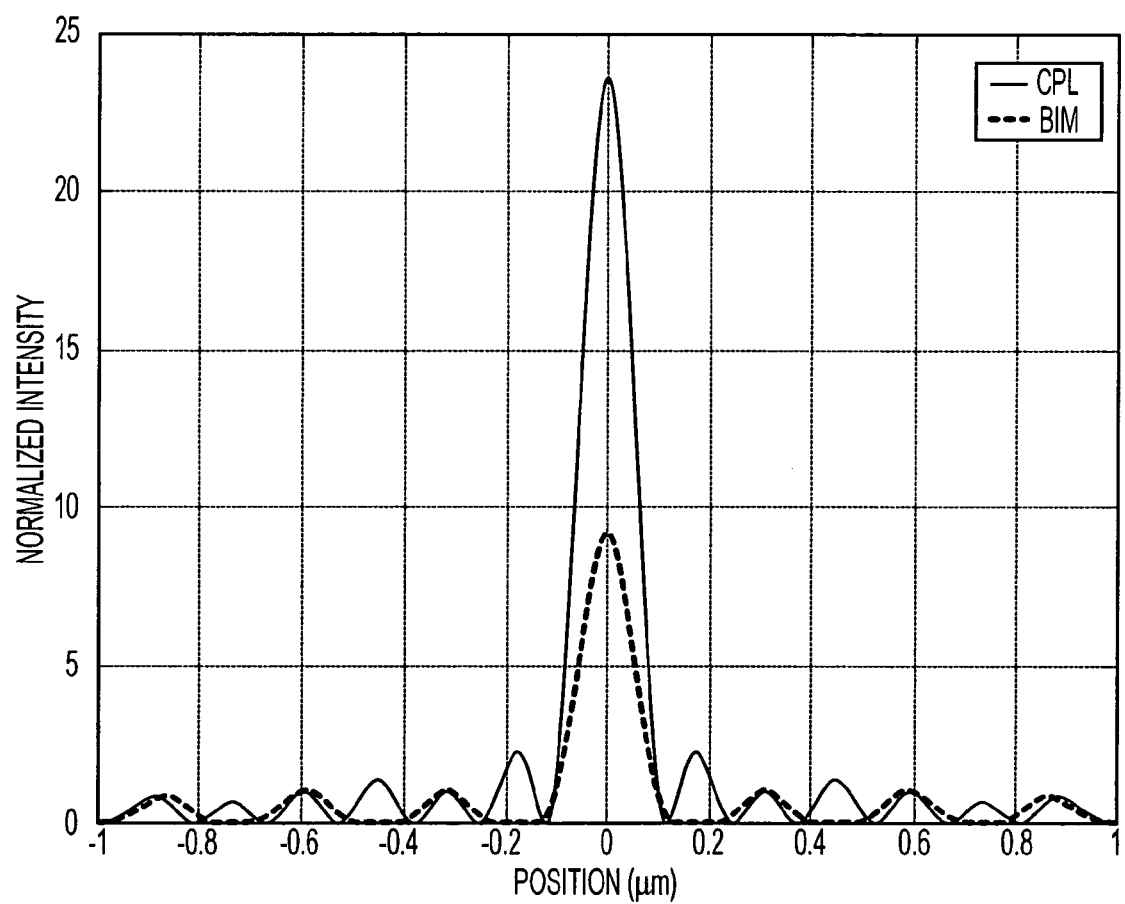
FIG. 2 illustrates normalized aerial images along the x axis for binary and CPL masks.

As previously mentioned, the binary Fresnel lens and CPL Fresnel lens are designed by taking advantage of the PSF lobes. The intensity along the x axis for both the binary and the CPL Fresnel lens is shown in FIG. 2. In FIG. 2, the intensity has been normalized such that a clear field mask has intensity of 1. In both types of masks, the peak intensity is much larger than 1. The binary Fresnel mask has peak intensity of about 9.2, and the CPL Fresnel mask has peak intensity of about 23.6. In both mask types, there is no side-lobe printing problem, because peak intensity well exceeds the magnitudes of the side lobes.

However, for a random contact hole pattern, the optimal transmission of the reticle can be calculated similar to the method used for an isolated contact. Since calculation of the electric field in the wafer plane is a linear process, the electric field of a random contact hole pattern is calculated through superposition. In superposition, the electric field is the summation of the individual contributions from each contact hole. Using this principle, the optimal transmission of the reticle can also be calculated for a random contact hole pattern. This is accomplished by first replacing each contact hole with a Dirac delta function. A Dirac delta function may be used because a low k1 contact hole essentially has the same image as the PSF. However, other functions may be used to represent a contact hole. Function choice is well within the level of ordinary skill in the art. The interference map is created by convoluting the Dirac delta function representation of the random contact hole mask with the PSF. The CPL mask is then created from this interference map by placing 100% transmission, 0° phase-shifted areas where the interference map is greater than zero and by placing 100% transmission, 180° phase-shifted areas where the interference map is less than zero.

Figure 3A:
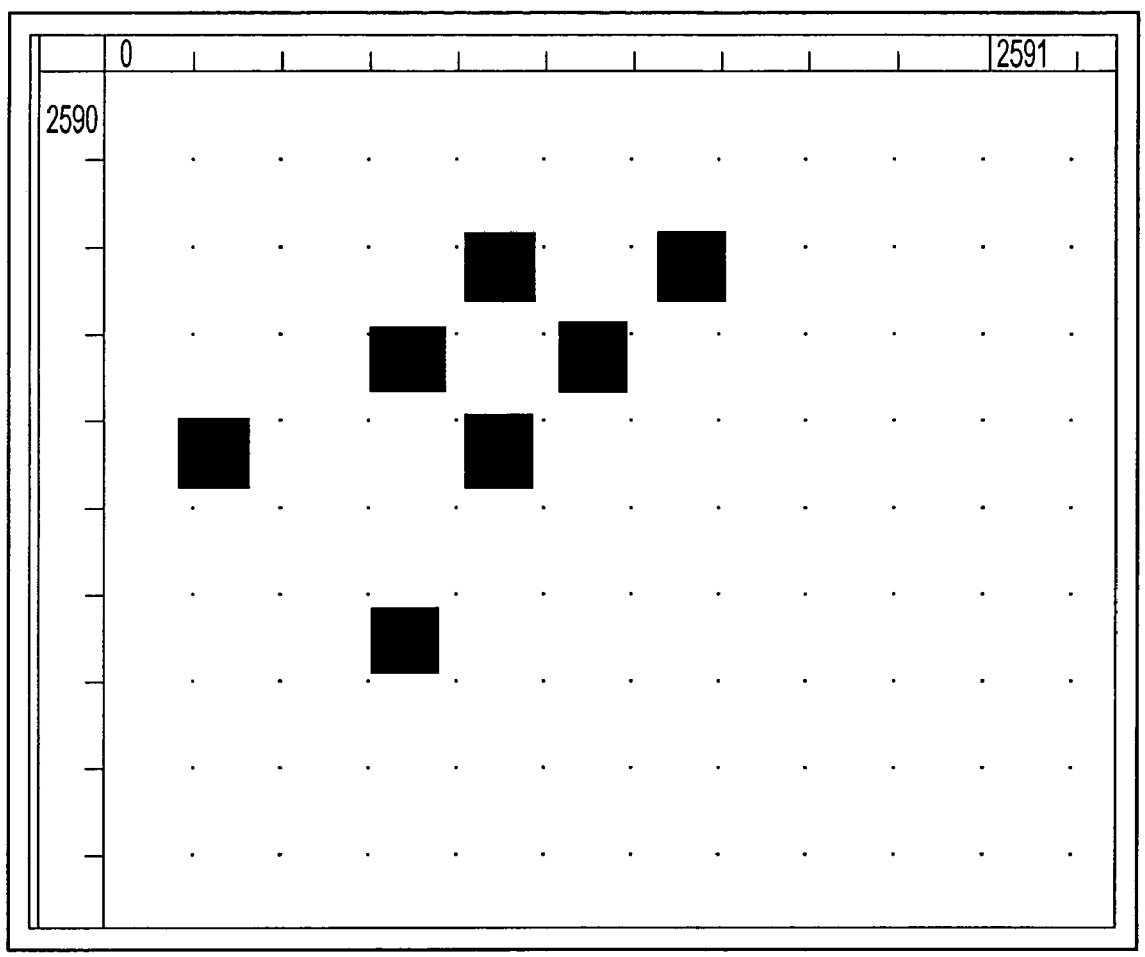
FIG. 3($a$) illustrates an exemplary random pattern of seven contact holes.
Figure 3B:
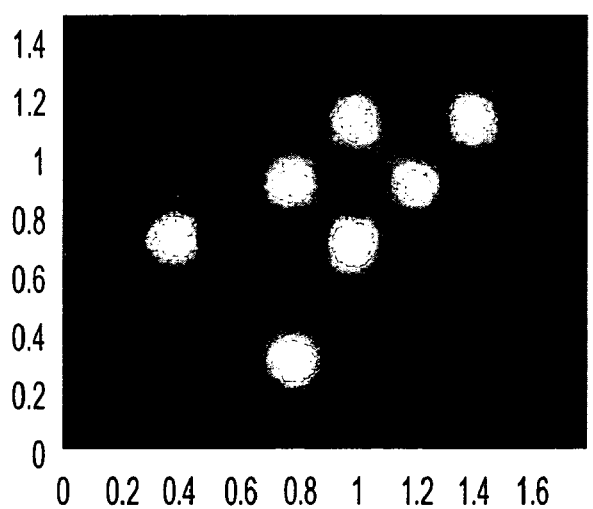
Figure 4A:
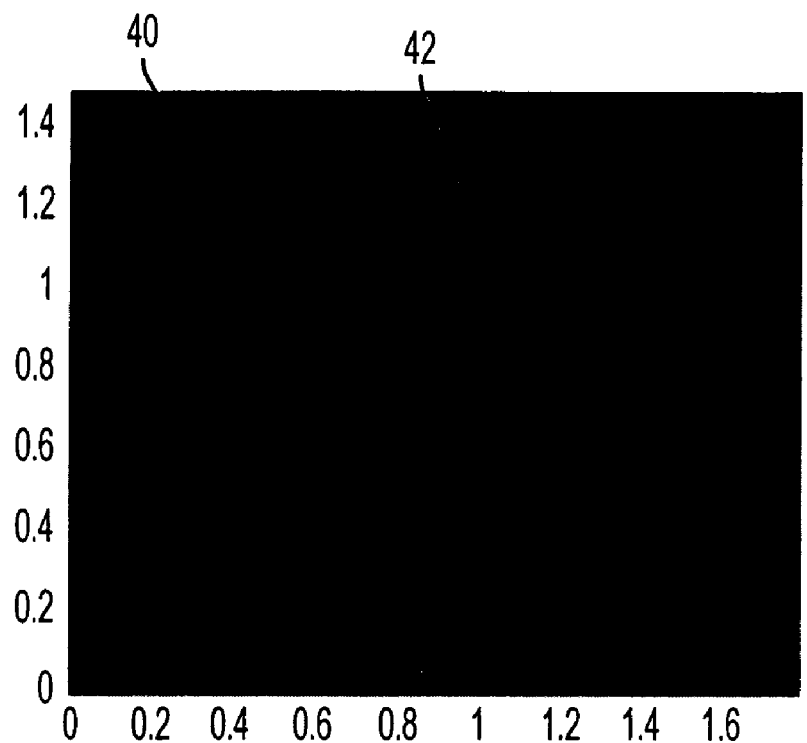
FIG. 4($a$) illustrates an exemplary CPL mask for the contact hole pattern of FIG. 3($a$).
Figure 4B:
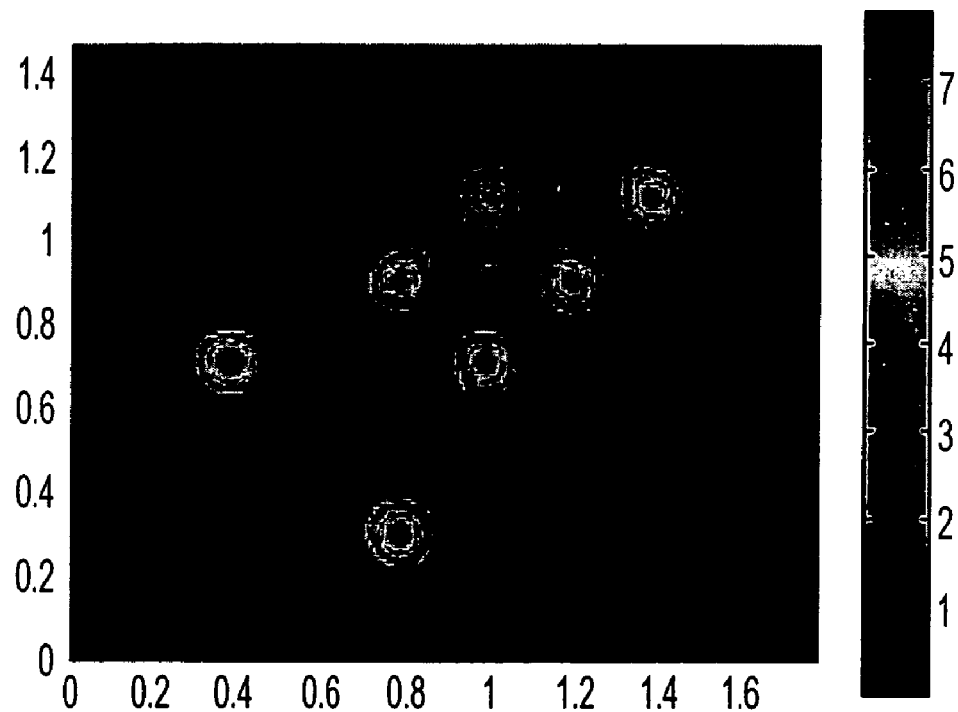

FIG. 3A illustrates a random contact hole pattern having seven contact holes, and FIG. 3B illustrates the corresponding interference map. The conversion of the interference map into a CPL mask is shown in FIGS. 4A and B. In FIG. 4A, shaded area 40 represents the 100% transmission, 0° phase-shifted areas and shaded area 42 represents the 100% transmission, 180° phase-shifted areas. The aerial image of the mask in FIG. 4A is shown in FIG. 4B. FIG. 4B shows that the IML CPL mask can achieve intensities approaching 7 times the clear field intensity. The image also shows that seven discrete contacts are produced even though there are large regions of 100% transmission, 0° phase-shifted areas and of 100% transmission, 180° phase-shifted areas in the interference map.

The same techniques used in creating the interference map for coherent imaging can be modified to create the interference map for partially coherent imaging. The phase of a partially coherent source is a random quantity, and imaging with a partially coherent source is a stochastic process. Consequently, linear methods, as described above, are no longer applicable.

In image processing, an autocorrelation of an image can be converted into a sum of coherent systems through the Karhunen-Loeve transform. Likewise in optical lithography, the partial coherence of the source used in a scanner can be decomposed into a sum of coherent systems (SOCS) by performing singular value decomposition (SVD) on the transmission cross coefficient (TCC). Mathematically, the TCC is the autocorrelation of the source with the projection pupil. Therefore, the TCC represents the imaging capability of the scanner.

Using SOCS, the TCC can be decomposed into a set of eigenfunctions, $\Phi$, and eigenvalues, $\lambda$. These eigenfunctions represent a pseudo-electric field transfer function of the scanner. The eigenfunctions in SOCS are analogous to the PSF used for a scanner with a coherent source. In fact, using SVD on the TCC for a coherent point source results in one eigenfunction, and this eigenfunction is the PSF. By using SOCS for a partially coherent source, the total intensity of the image can be calculated by summing the square of each eigenfunction convoluted with the mask transmission. This methodology is shown by the flowchart of FIG. 5.

Figure 5:
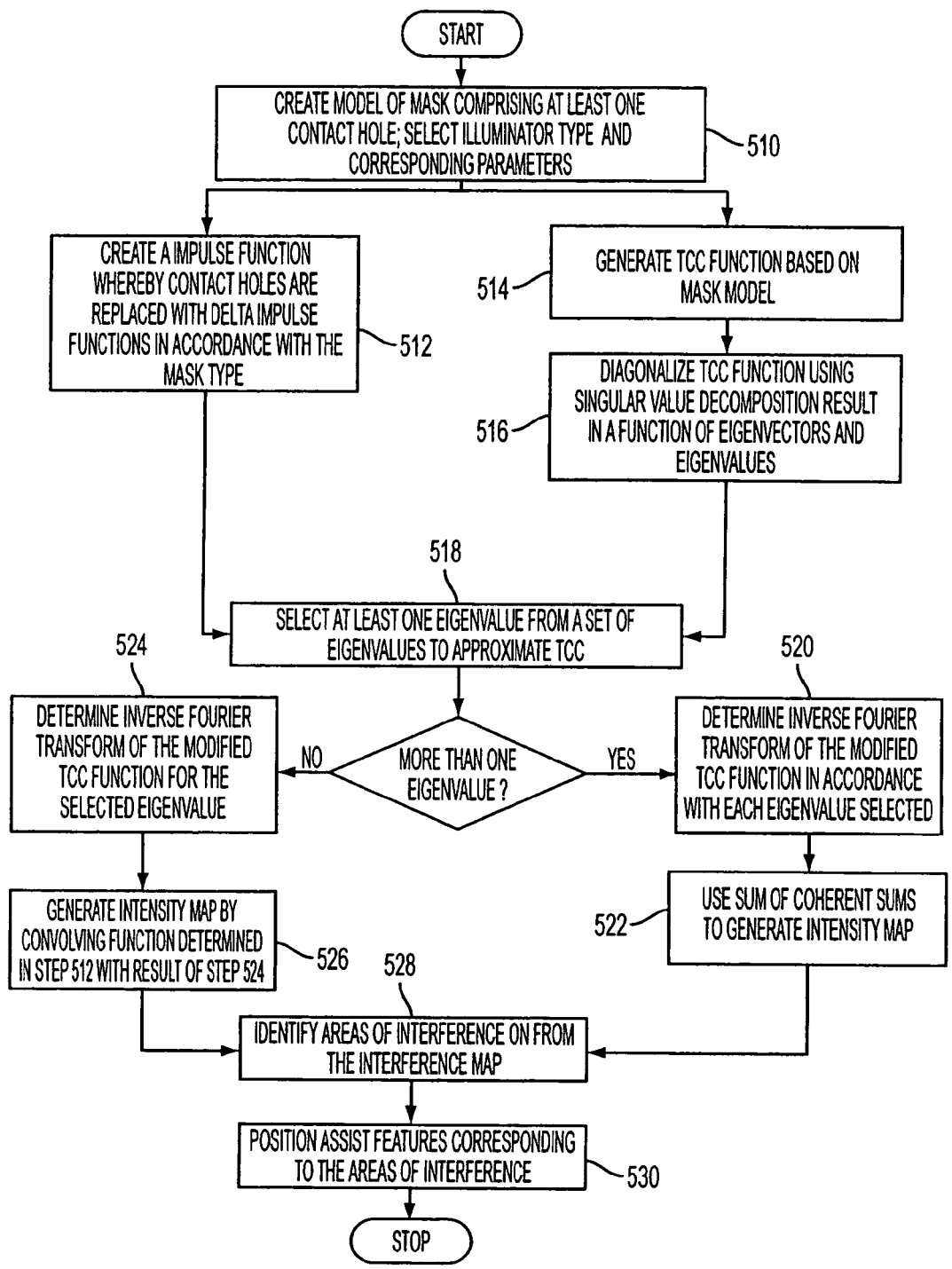
FIG. 5 shows a flow chart of the steps for determining placement of assist features and maximmizing EL and DOF.

The disclosed concepts may be represented by a series of steps, as illustrated by the flow chart of FIG. 5. In Step 510, a mask model is created including at least one contact hole. Also, the illuminator type and corresponding parameters are chosen. In Step 512, an impulse function is created whereby each contact hole of the mask is represented by an impulse delta function in accordance with the mask type (e.g., phase shifting mask, regular mask). Concurrently therewith, in Step 514, the TCC is generated based on the illumination and projection lens model, and in Step 516, the complex TCC function is simplified by diagonalizing the function using SVD resulting in a function of eigenvectors and eigenvalues. In Step 518, at least one eigenvalue is selected for approximating TCC. If more than one value is selected, in Step 520, the inverse Fourier transform of each eigenfunction is calculated for each eigenvalue selected, the results of which are summed in accordance with SOCS, as in Step 522. On the other hand, if only one eigenvalue is selected, in Step 524, the inverse Fourier transform is calculated for the selected value the result of which is convolving with the fraction of step 512 to generate an intensity map (Step 526). The results of either of Steps 524 or 526 represent an aerial image or interference map corresponding to the illumination on the substrate. In Step 528, areas of interference are identified on the interference map, and in Step 530, assist features are optimally positioned in a mask corresponding to the areas of interference.

Advantages of this methodology is that the SVD of an autocorrelation quantity has superior energy compaction, i.e., the least number of orthogonal eigenfunctions are needed to represent the autocorrelation. Therefore, the eigenvalues from SOCS indicate the amount of energy each eigenvalue has on the total intensity. Since SVD has superior energy compaction, SOCS requires the fewest eigenfunctions to represent the total intensity. Another advantage of this methodology is that the eigenvectors of the TCC are coherent. Consequently, coherent imaging theory described in [54] through [60] can be applied to each coherent eigenvector.

Figure 6A:
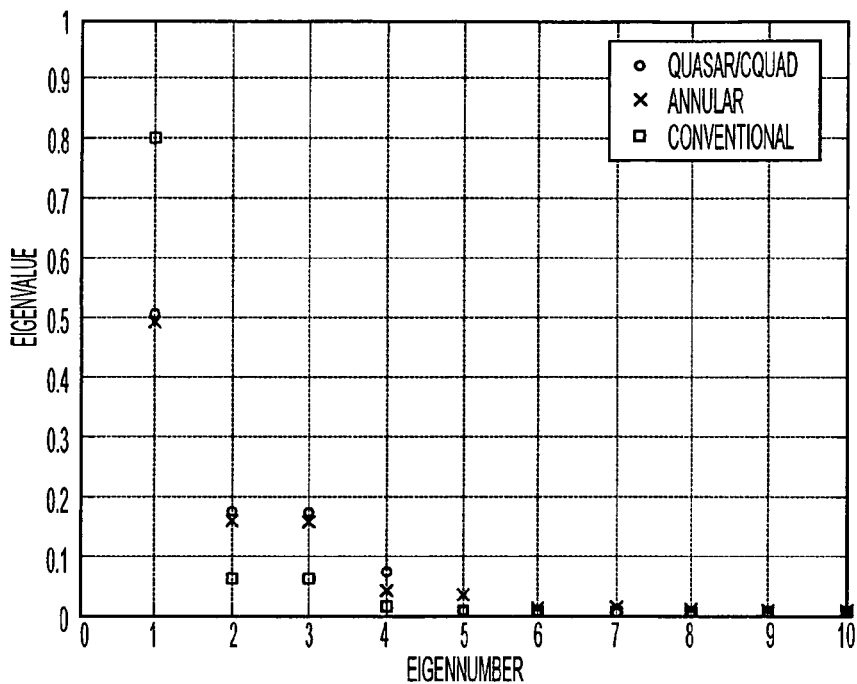
FIG. 6($a$) illustrates a plot of eigenvalues for various illuminations.

This concept is illustrated by FIG. 6A, in which eigenvalues for various illumination conditions are plotted. FIG. 6A shows that the eigenvalues decay very rapidly, and thus only a few eigenvalues and eigenfunctions are needed to calculate the aerial image intensity. For example, the first eigenvalue (eigen number of 1) represents about 80% and 50% of the TCC for conventional illumination and Quasar/Cquad and annular illumination, respectively. Although the first eigenfunction for Quasar/Cquad and annular illumination represents 50% of the TCC, the first eigenfunction actually contributes more than 95% to the total aerial image intensity.

Figure 6B:
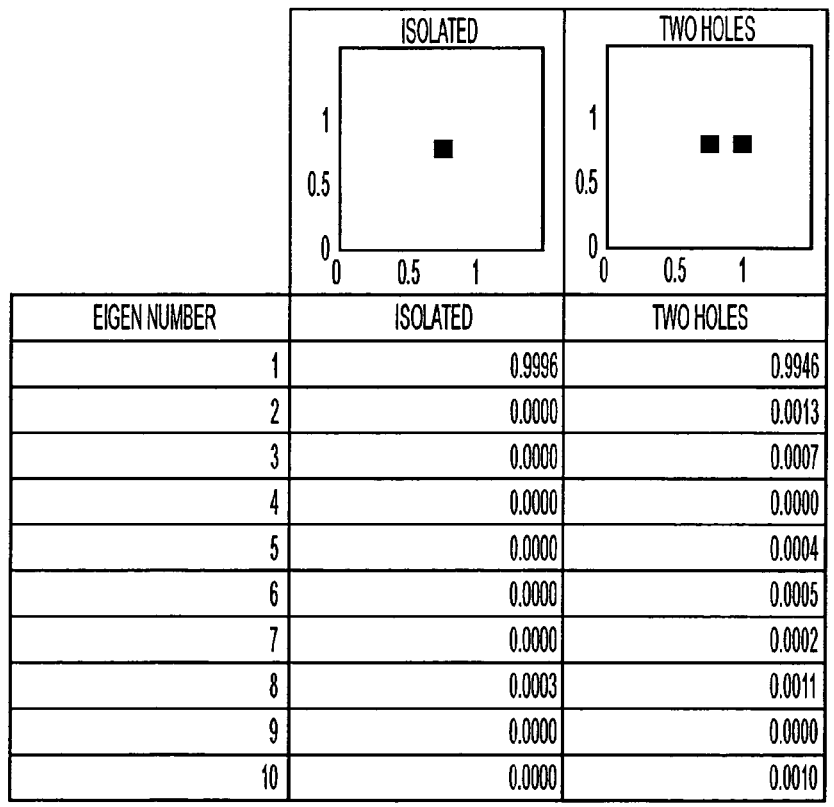

In FIG. 6B, the percentage of each eigenfunction on the peak intensity is calculated with Quasar illumination for a single isolated contact and for a double hole contact and is shown in tabulated form. It indicates that almost 100% of the peak intensity is contributed by the first eigenfunction for the isolated contact, and that 99.5% of the peak intensity is contributed by the first eigenfunction for the double contact. In fact, the first eigenfunction contributes most of the peak intensity because of the symmetry of the first eigenfunction and of the mask.

The first eigenfunction is even with respect to the x and y axes. The second eigenfunction is even with respect to the x axis and odd with respect to the y axis while the third eigenfunction is odd to the x axis and even to the y axis. The isolated contact is also even with respect to the x and y axes. From system analysis theory, only convolution of an even x and y axis mask with an even x and y axis eigenfunction transfer function will cause a contribution to the peak intensity. This contribution begins to break down as the symmetry of the mask changes. For the two contact example the mask is no longer symmetric with respect to the x axis. Consequently, eigenfunctions with odd symmetry begin to have an effect on the intensity. However, the first eigenfunction still contributes over 99% to the peak intensity for the double contact hole example.

Figures 1, 7A:
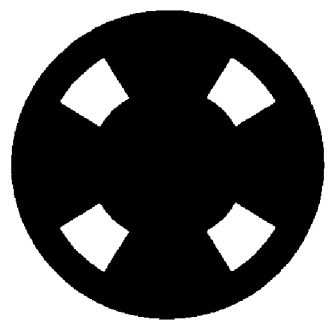
Figures 2, 7A:
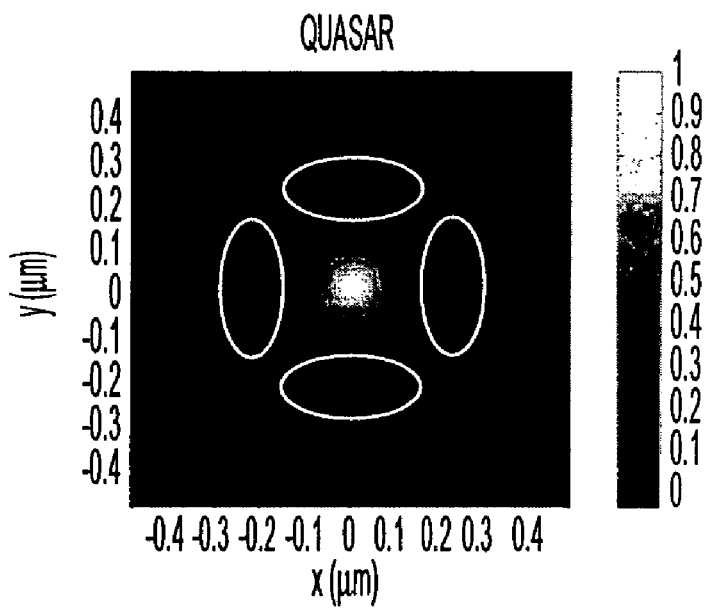
Figures 1, 7B:
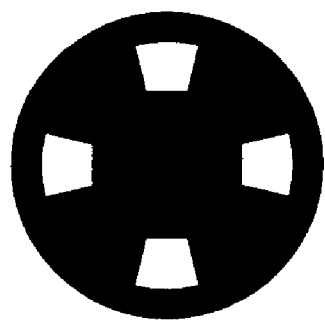
Figures 2, 7B:
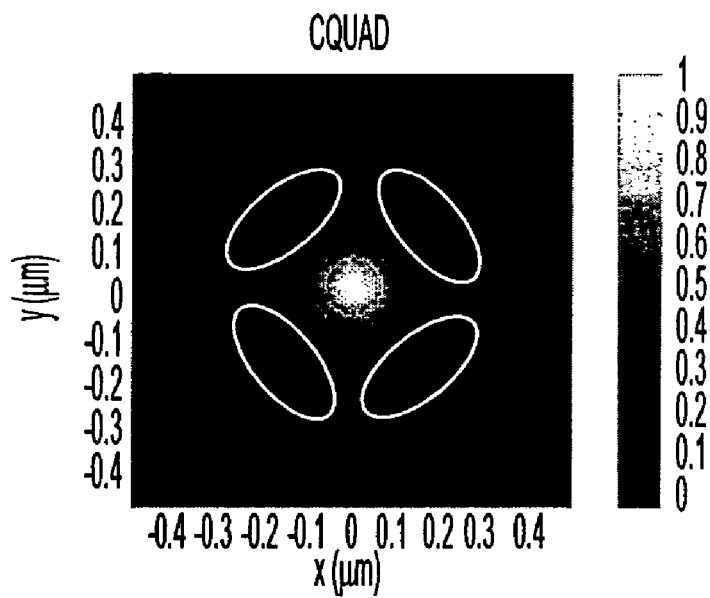
Figures 1, 7C:
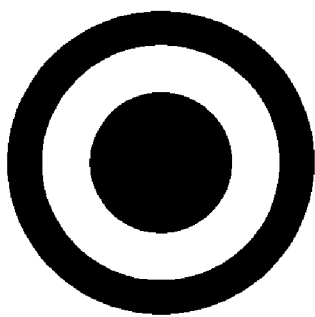
Figures 2, 7C:
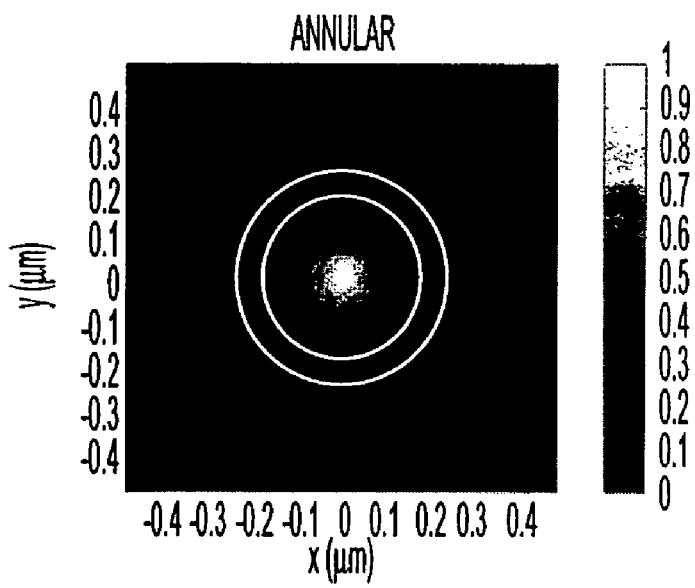
Figures 1, 7D:
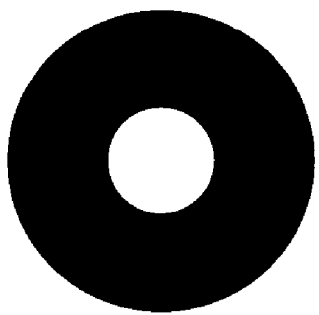
Figures 2, 7D:
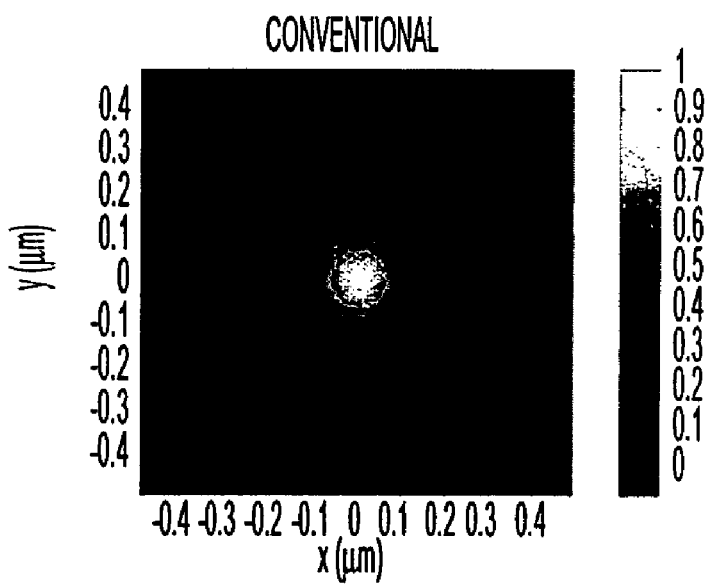

In FIGS. 7A-D, the first eigenfunction is plotted for the illumination conditions used in generating the eigenvalues in FIGS. 6A-B for Quasar, Cquad, Annular and Conventional illuminations, respectively. Plots of eigenfunctions are theoretical. In FIG. 7a, Quasar illumination generates an eigenfunction kernel with lobes along the x and y axis while in FIG. 7B Cquad illumination generates a kernel with lobes along diagonals relative to the x and y axis. For annular and conventional illumination (FIGS. 7C and 7D, respectively), a rotationally symmetric lobe is generated because the illumination is rotational symmetric. Cross sections along the x axis of these kernels are in FIG. 8 along with the PSF for comparison.

Figure 8:
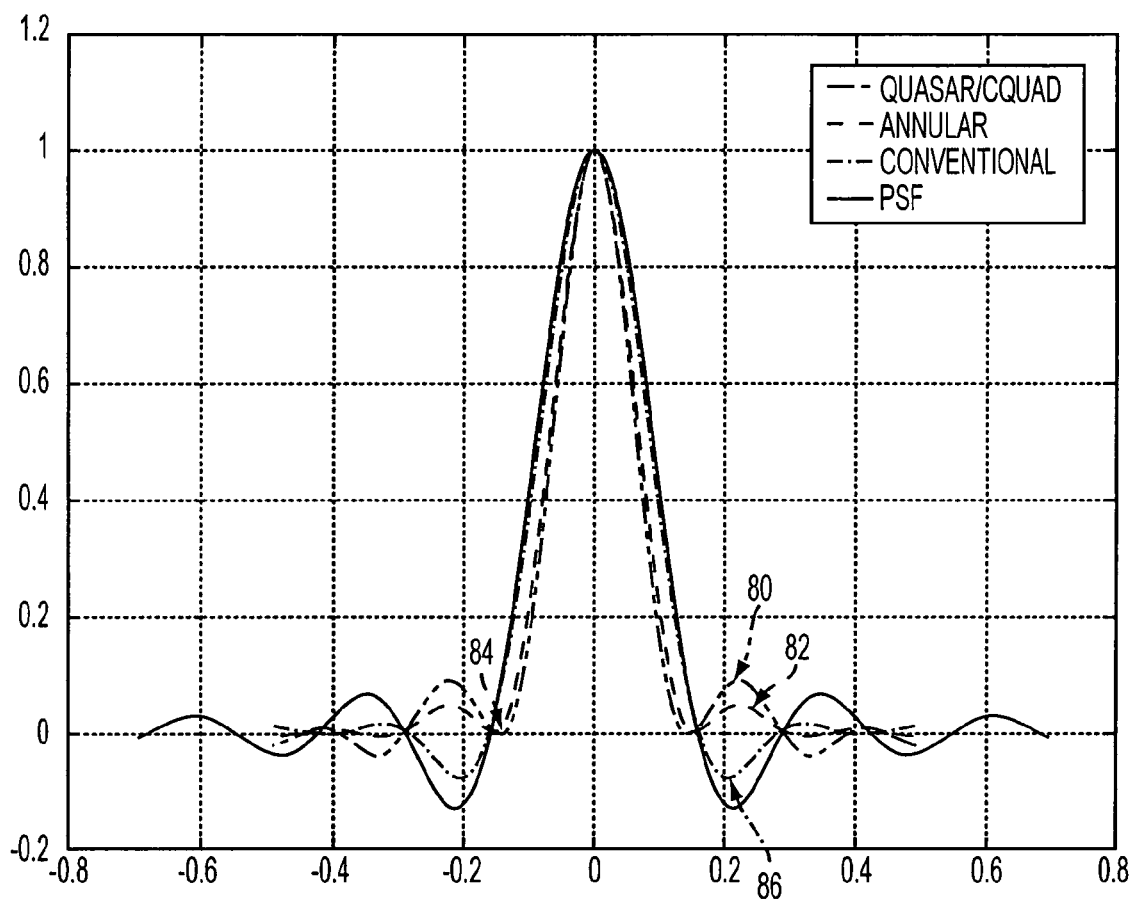
FIG. 8 illustates aerial images along the x axis for various types of illumination.

FIG. 8 shows that the Quasar/Cquad side lobe peaks 80 are larger than annular side lobe peaks 82. Consequently, AFs in Quasar and Cquad illuminations will contribute more to the aerial image because the AF will focus a larger intensity on the feature. Also, in FIG. 8, the first minimum 84 for Quasar/Cquad and annular illuminations are greater than zero; therefore, a phase shifted background will contribute negatively to the peak intensity with these illuminations. However, for conventional illumination, there is a large negative lobe 86;

consequently, a phase shifted background will contribute positively to the peak intensity. By understanding these kernel lobes, the intensity can be improved. Since the intensity is calculated by convoluting the mask transmission with the first eigenfunction kernel, the peak intensity of a contact hole can be improved by placing a clear 0° assist feature where the lobe is greater than zero and by placing a clear 180° assist feature where the lobe is less than zero.

Figure 9:
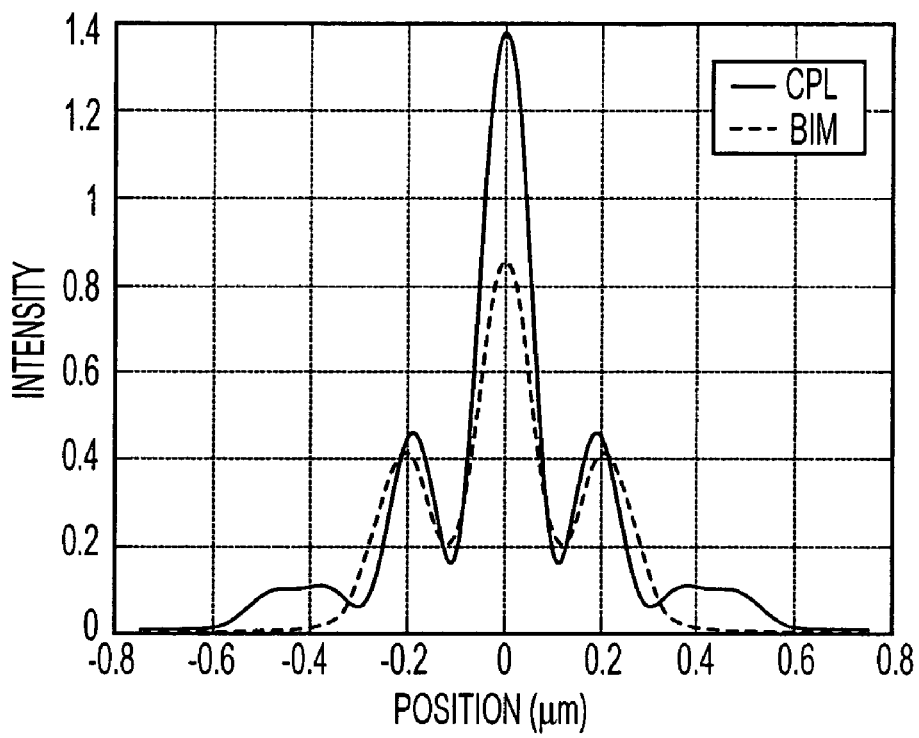
FIG. 9 illustrates aerial images along the x axis for CPL and binary masks.

A binary mask may be constructed by placing a clear feature where the eigenfunction kernel is above a threshold value. A CPL mask may be constructed by placing a 0° phase-shifted clear feature when the eigenfunction kernel is greater than zero and by placing a 180° clear feature when the kernel is less than zero. An aerial image along the x axis is shown in FIG. 9 for these two masks. The peak intensity with CPL is nearly 1.4 while the peak intensity with binary mask with AF is 0.87. In both mask types, the peak intensity is two times greater than the side lobe intensity. Consequently, there is no possibility of the side lobes printing.

Methods, other than that described above, for designing binary masks with AF and for designing CPL masks may be utilized and are well within the level of those of ordinary skill in the art.

The following describes a method for improving the maximum exposure latitude (EL) for a random contact hole pattern. A exemplary flow chart is shown in FIG. 5.

For contact hole imaging, the peak intensity is correlated to the exposure latitude (EL), i.e., by maximizing the peak intensity the EL is maximized.

Similar to coherent imaging, in a partial coherent system, the first step (Step 1) in the EL optimization is to replace contact holes in the original mask, O(x,y), with Dirac delta functions or line functions. For a square contact centered at $(x_i, y_i)$, the Dirac delta function is given by Equation 1.0.

$$\delta(x-x_i, y-y_i) \quad \text{Equation 1.0}$$

For a rectangular contact centered at $x_i$ with extent $y_a$ to $y_b$, the line function is given by Equation 2.0.

$$\delta(x-x_i)\text{rect}(y_a \leq y \leq y_b) \text{ where rect}(y)=1 \text{ for } y \geq y_a \text{ \& } y \leq y_b, \text{ and rect}(y)=0 \text{ elsewhere.} \quad \text{Equation 2.0}$$

These delta functions and line functions are then summed for all contact locations $(x_i, y_i)$ creating a function $\Delta(x,y)$, represented by Equation 3.0.

$$\Delta(x, y) = \sum_{i=1}^{N} \delta(x-x_i, y-y_i) \quad \text{Equation 3.0}$$

The second step (Step 2) in the EL optimization, is to convolute the $\Delta(x,y)$ (Equation 3.0) with the first eigenfunction at 0 defocus, $\Phi_1(x,y,z=0)$. It is noted that more than one eigenfunction may be utilized. This convolution creates the interference map, $F_i(x,y)$, as shown by Equation 4.0.

$$F_i(x, y) = \int_{-\infty}^{\infty}\int_{-\infty}^{\infty} \Delta(x-x', y-y')\Phi_1 \quad \text{Equation 4.0}$$
$$(x', y', z=0)dx'dy'$$

In the third step (Step 3), the interference map, $F_i$, is replaced with discrete mask transmissions, F, in order to maximize $G_1$ at the center of all the contacts $(x_i, y_i)$, as is represented by Equation 5.0.

$$G_1(x, y) = \int_{-\infty}^{\infty}\int_{-\infty}^{\infty} F(x-x', y-y')\Phi_1 \quad \text{Equation 5.0}$$
$$(x', y', z=0)dx'dy'$$

For a CPL mask, the discrete mask transmissions, F, are −1 (etched quartz), 0 (chrome), and +1 (unetched quartz). For a binary mask, F is 0 (chrome) or +1 (unetched quartz). The discrete mask geometry is also chosen to simplify mask manufacturing.

In the fourth and last step (Step 4), the assist feature size in F is chosen such that intensity side lobes do not print. To satisfy this criterion, the discrete mask transmissions, F, are selected such that the condition below for $G_2$ is minimized for points outside the contact, $O(x,y) \neq 1$, and is represented by Equation 6.0.

$$G_2(x, y) = \left|\int_{-\infty}^{\infty}\int_{-\infty}^{\infty} F(x-x', y-y')\Phi_1 \right. \quad \text{Equation 6.0}$$
$$\left.(x', y', z=0)dx'dy'\right|^2$$

Figure 10A:
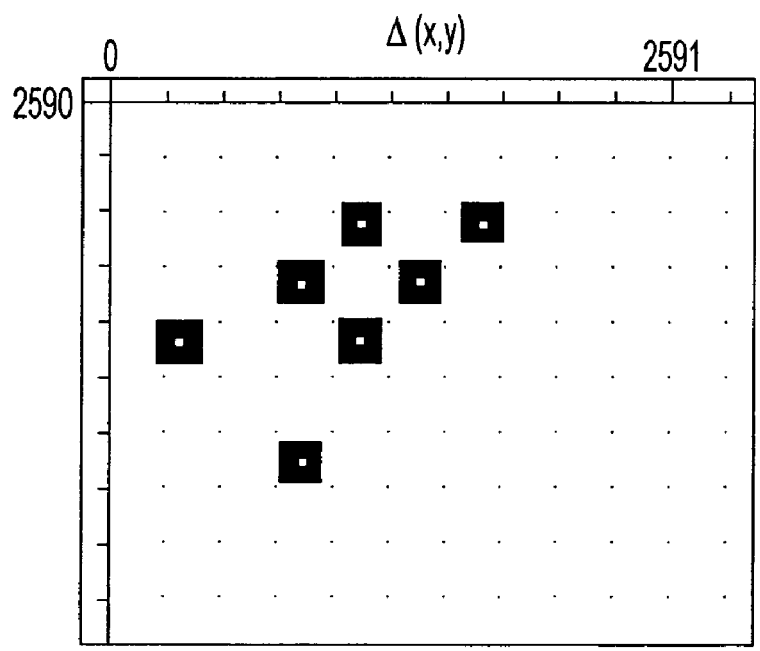
FIG. 10($a$) illustrates a representation of the mask of FIG. 3($a$) having contact holes replaced by Dirac delta function.
Figure 10B:
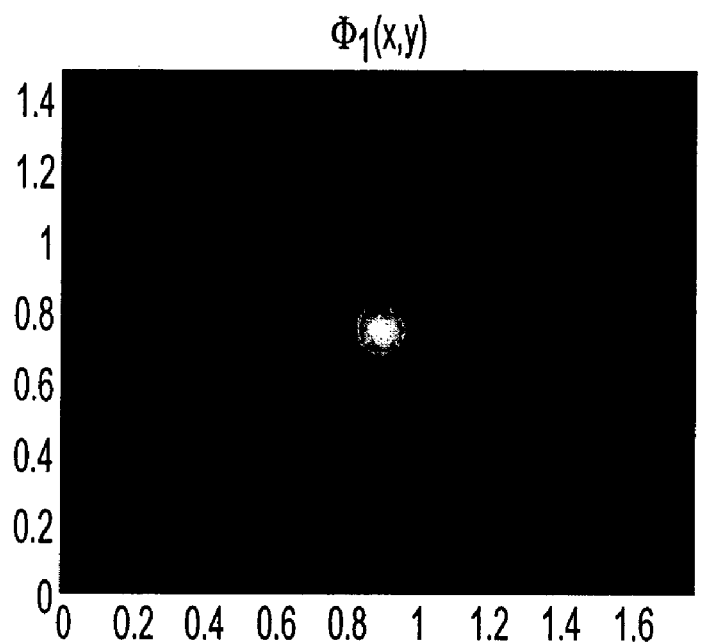
Figure 10C:
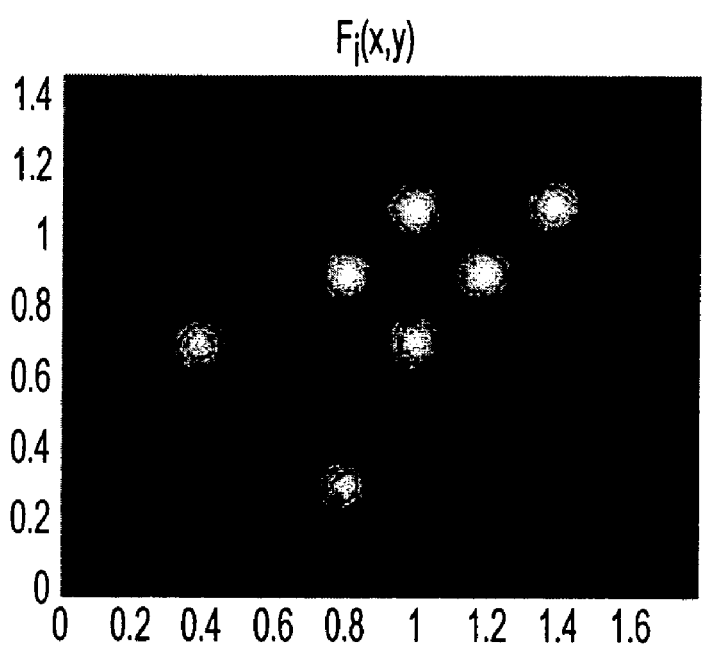

As an example, following Steps 1 and 2, an interference map was generated for a 100 nm contact hole design ($k_1$=0.39). FIG. 10A illustrates a representation of the mask represented by Equation 3.0, described above, and corresponds to the results from Step 1. As can be seen, each contact hole has been replaced with a Dirac Delta function. FIG. 10B illustrates an aerial image of an eigenfunction generated for Quasar illumination. FIG. 10C represents the aerial image or interference map resulting from Step 2. The conditions used in creating this map are an ASML/1100 ArF NA=0.75 scanner with Quasar illumination ($\sigma_{in}$=0.57, $\sigma_{out}$=0.87, and 30° span angle).

Figure 11:
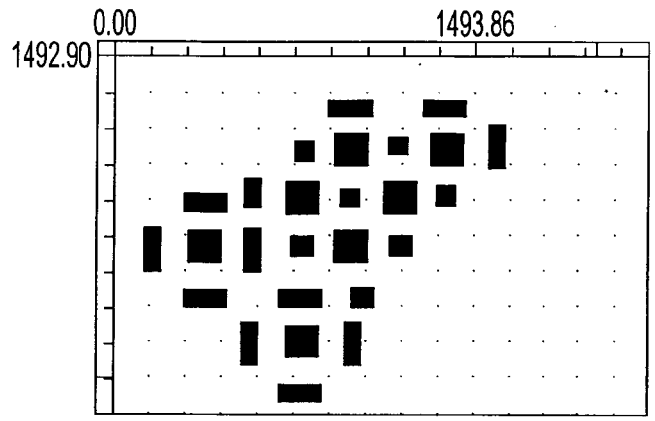
FIG. 11 illustrates a binary mask optimized according to the aerial image of FIG. 10($c$).
Figure 12A:
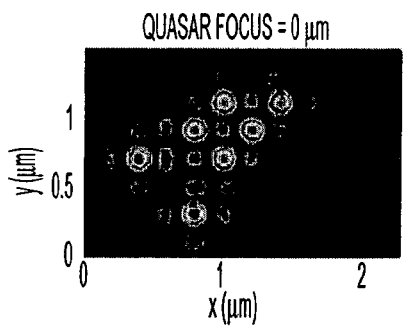
FIGS. 12($a$)-($c$) illustrate aerial images of the optimized mask of FIG. 11 plotted for a focus of 0, 0.1, and 0.2 µm, respectively.
Figure 12B:
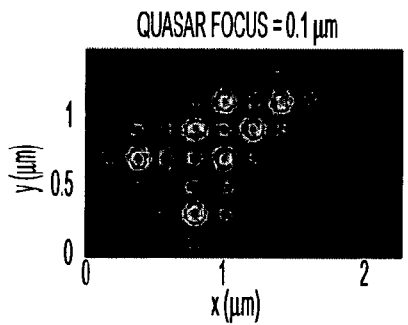
Figure 12C:
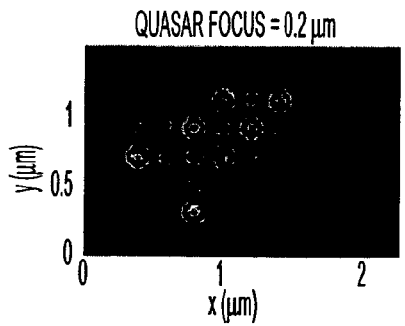

From the interference map, a binary discrete transmission mask, F, is determined by using Steps 3 and 4 for maximizing the EL and for minimizing the side lobe printing, respectively. The binary mask, which optimizes EL, is shown in FIG. 11 and aerial images of the optimized mask in FIG. 11 is plotted in FIGS. 12A-C through a focus range of ±0.2 µm. In FIGS. 12A-C, model based OPC biasing of the mask was not performed; however, with OPC biasing a peak intensity of 0.4 can be achieved for all seven contact holes through 0.4 µm DOF without the printing of side lobes.

Figure 13:
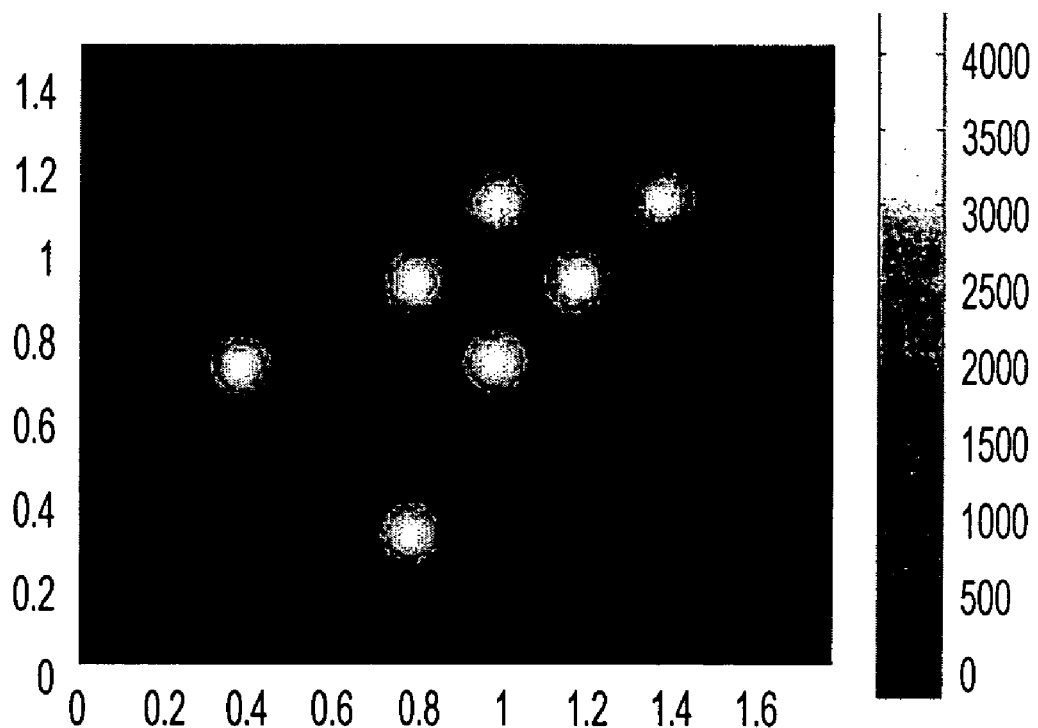
FIG. 13 illustrates the interference map generated for the mask of FIG. 3($a$) for Cquad illumination.
Figure 14:
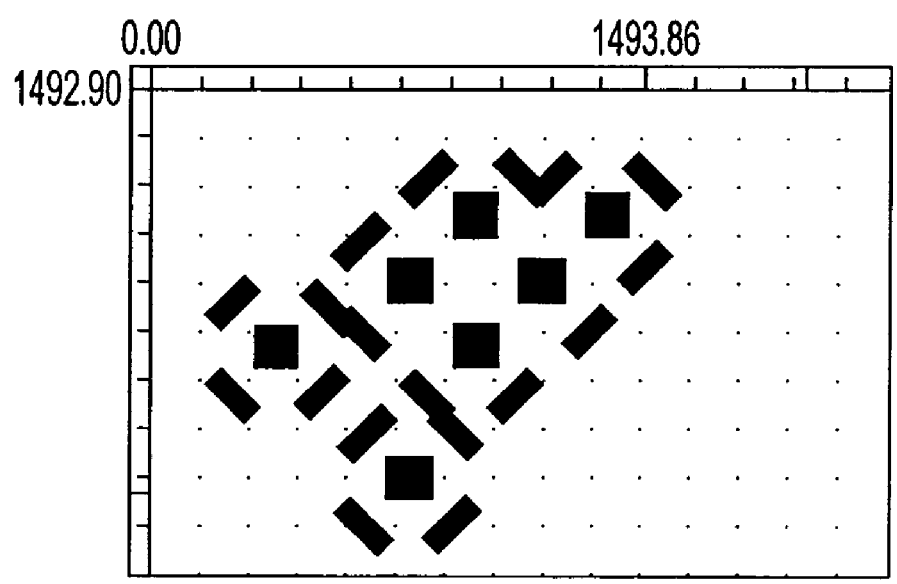
FIG. 14 illustrates a binary mask that optimizes exposure latitude for the interference map of FIG. 13.
Figure 15A:
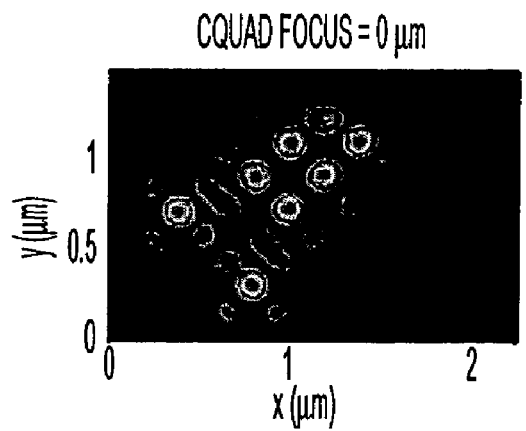
FIGS. 15($a$)-($c$) illustrate aerial images of the optimized mask plotted of FIG. 14 for a focus of 0, 0.1, and 0.2 µm, respectively.
Figure 15B:
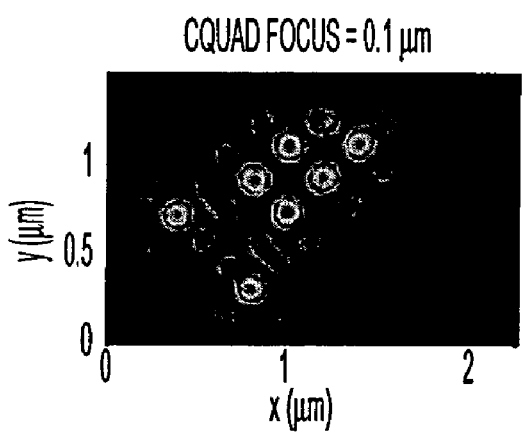
Figure 15C:
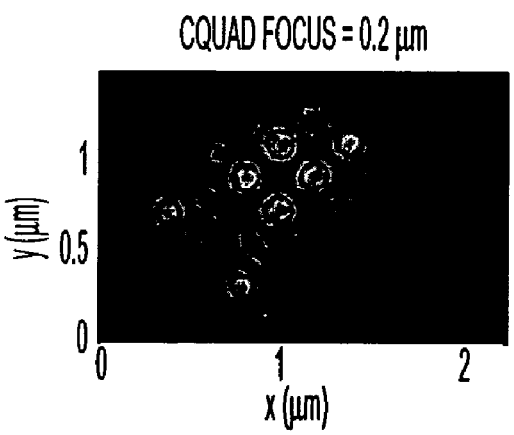

In another example, the interference map is calculated for Cquad illumination (λ=193 nm, NA=0.75, $\sigma_{in}$=0.5, $\sigma_{out}$=0.8, 30° span angle), and is shown in FIG. 13. The interference map indicates that the optimal location to place AFs is along diagonals rather than on the x or y axes. This shows that the optimal location for placing AFs is highly dependent on the illumination. From this interference map in FIG. 13, the binary discrete transmission mask is calculated by using steps 3 and 4 above. The binary mask, which optimizes EL, is shown in FIG. 14. The aerial image of the optimized mask in FIG. 14 is plotted in FIG. 15 through a focus range of ±0.2 µm. Comparing the aerial image in FIG. 15 for Cquad illumination to the aerial image in FIG. 12 for Quasar illumination, it is seen that Cquad illumination image has larger peak intensity in the dense 200 nm pitch region as compared to Quasar illumination. Due to this dense pitch, Cquad is a better illumination choice than Quasar.

Figure 16A:
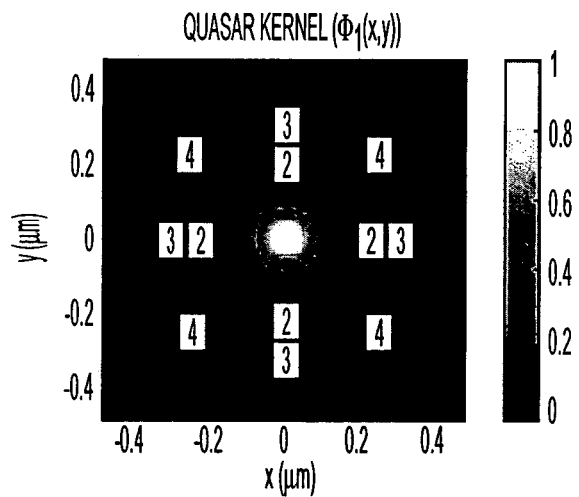
FIGS. 16($a$)-($b$) illustrate the first eigenfunction and fourth eigenfunction, respectively, plotted for quasar illumination.
Figure 16B:
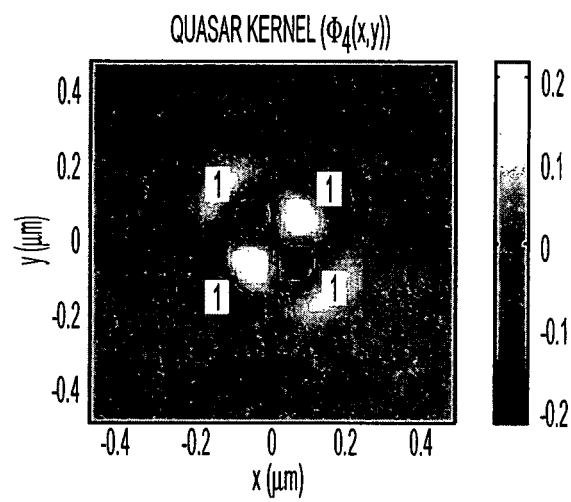

The four steps methodology for maximizing EL demonstrated above uses only one eigenfunction. However, the theory can also be expanded to include multiple eigenfunctions. In FIGS. 16A-B, the first eigenfunction, $\Phi_1$, and the fourth eigenfunction, $\Phi_4$, are plotted for Quasar illumination ($\lambda$=193 nm, NA=0.75, $\sigma_{in}$=0.57, $\sigma_{out}$=0.87, 30° span angle). The fourth eigenfunction has an odd symmetry with respect to the x and y axes. This odd symmetry indicates that out of phase AFs along the diagonals should be used in order to improve the peak intensity.

Figure 16C:
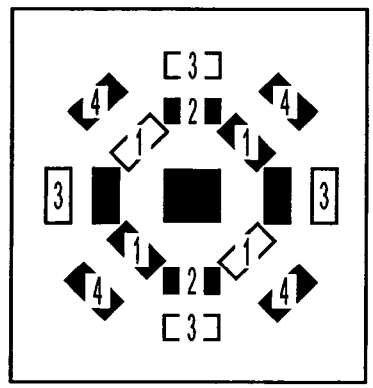

In FIGS. 16A and B, the lobes of the $\Phi_1$ and $\Phi_4$ are ordered from the lobe with the largest magnitude (designated with 1 on $\Phi_4$) (FIG. 16B) to the smallest lobe (marked with 4 on $\Phi_1$) (FIG. 16A). In FIG. 16A, some of the lobes are less than zero such as the lobe marked with a 3. At the lobes that are less zero, a 180° phase-shifted, 100% transmittance AF should be placed. In FIG. 16C, the optimal mask resulting from eigenfunctions, $\Phi_1$ and $\Phi_4$, is a CPL mask. The solid areas are 0° phase-shifted, 100% transmittance, the cross-hatched areas are 180° phase-shifted, 100% transmittance, and the background area is opaque 0% transmittance.

Figures 1, 17A:
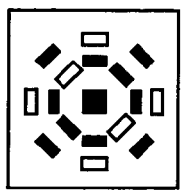
Figures 2, 17A:
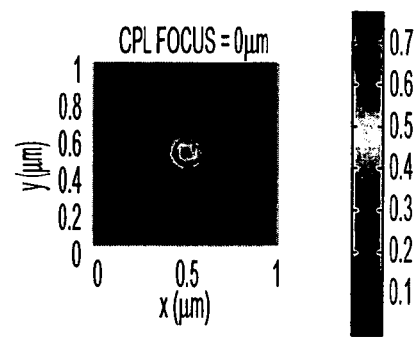
Figures 3, 17A:
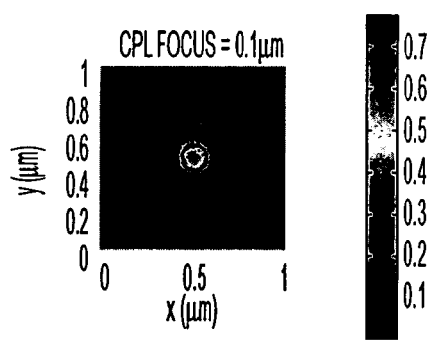
Figures 4, 17A:
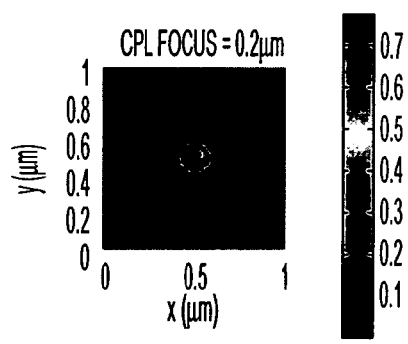
Figures 1, 17B:
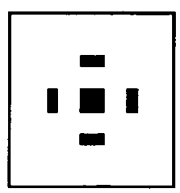
Figures 2, 17B:
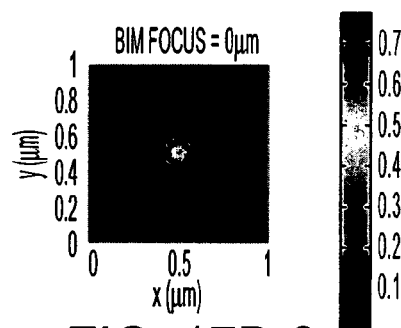
Figures 3, 17B:
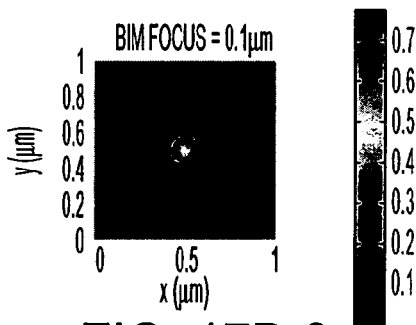
Figures 4, 17B:
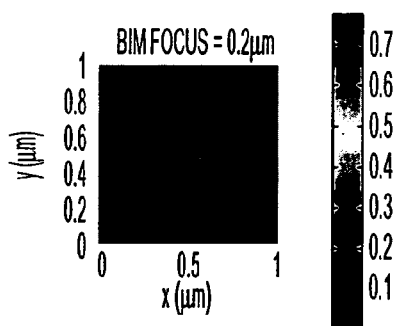
Figures 1, 17C:
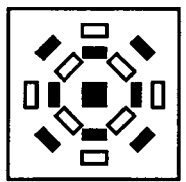
Figures 2, 17C:
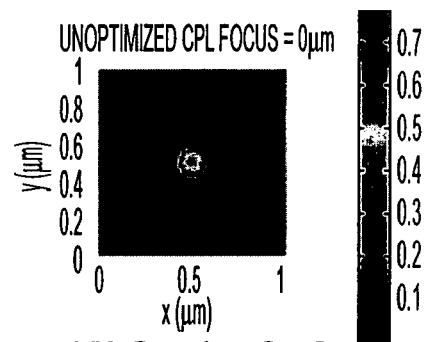
Figures 3, 17C:
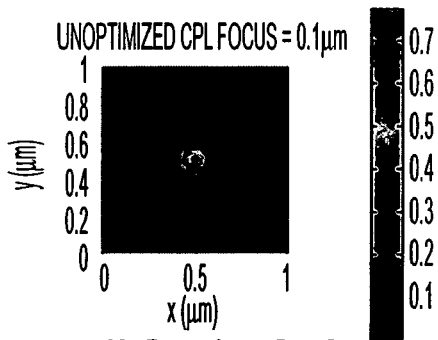
Figures 4, 17C:
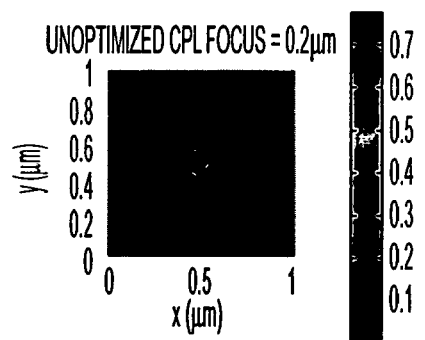

In FIG. 17a, the aerial image of the optimal mask in FIG. 16C is calculated. The maximum peak intensity is 0.645 at 0.2 μm defocus for this $k_1$=0.39 contact. The aerial image of the optimal mask is also compared to a binary optimized mask (FIG. 17B) and to a CPL mask without the odd symmetry from $\Phi_4$ in the AF, i.e., the mask has even symmetry (FIG. 17C). At 0 μm defocus, the peak intensity of the optimal mask (FIG. 17A) is 0.775 while the peak intensity of the binary mask is 0.5 and the peak intensity of the even CPL mask is 0.6. As can be seen, peak intensity of the optimal mask is superior through focus.

In addition to increasing the exposure latitude, depth of focus (DOF) can be maximized. Increasing the DOF is accomplished by balancing increased exposure latitude for increased DOF. First, in order to increase the DOF, Steps 1-4, described above, are performed with an additional step (Step 5). As in all minimization problems, the DOF increases if the change in peak intensity with respect to focus, z, is minimized. Mathematically, this may be accomplished by taking the partial derivative of intensity with respect to focus and by selecting mask transmission features that minimize this partial derivative, represented by Equation 7.0. The DOF is maximized by minimizing $G_3(x,y)$.

$$G_3(x, y) = \text{Re}\left[\int_{-\infty}^{\infty}\int_{-\infty}^{\infty} F(x-x', y-y')\Phi_1\left(x, y, z=\frac{1}{2}DOF\right)\right] \cdot \text{Re}\left[\int_{-\infty}^{\infty}\int_{-\infty}^{\infty} F(x-x', y-y')\frac{\partial}{\partial z}\Phi_1\left(x, y, z=\frac{1}{2}DOF\right)\right] + \text{Im}\left[\int_{-\infty}^{\infty}\int_{-\infty}^{\infty} F(x-x', y-y')\Phi_1\left(x, y, z=\frac{1}{2}DOF\right)\right] \cdot \text{Im}\left[\int_{-\infty}^{\infty}\int_{-\infty}^{\infty} F(x-x', y-y')\frac{\partial}{\partial z}\Phi_1\left(x, y, z=\frac{1}{2}DOF\right)\right]$$

Equation 7.0

In this step (Step 5), one must provide the DOF range over which to maximize. A typical DOF range is three times the critical dimension (CD). However, other ranges may be chosen and is well within the level of one of ordinary skill in the art.

Due to the trade off between optimization of EL and DOF, the addition of Step 5 introduces an inconsistency in the optimization determined in Step 4. The optimal transmission, F(x,y), cannot be chosen such that $G_2(x,y)$ is forced to a global maximum while simultaneously forcing $G_3(x,y)$ to a global minimum. Therefore, in order to increase the DOF, $G_3(x,y)$ is forced to the smallest value while forcing $G_2(x,y)$ to be a percentage of the global maximum.

Figure 18:
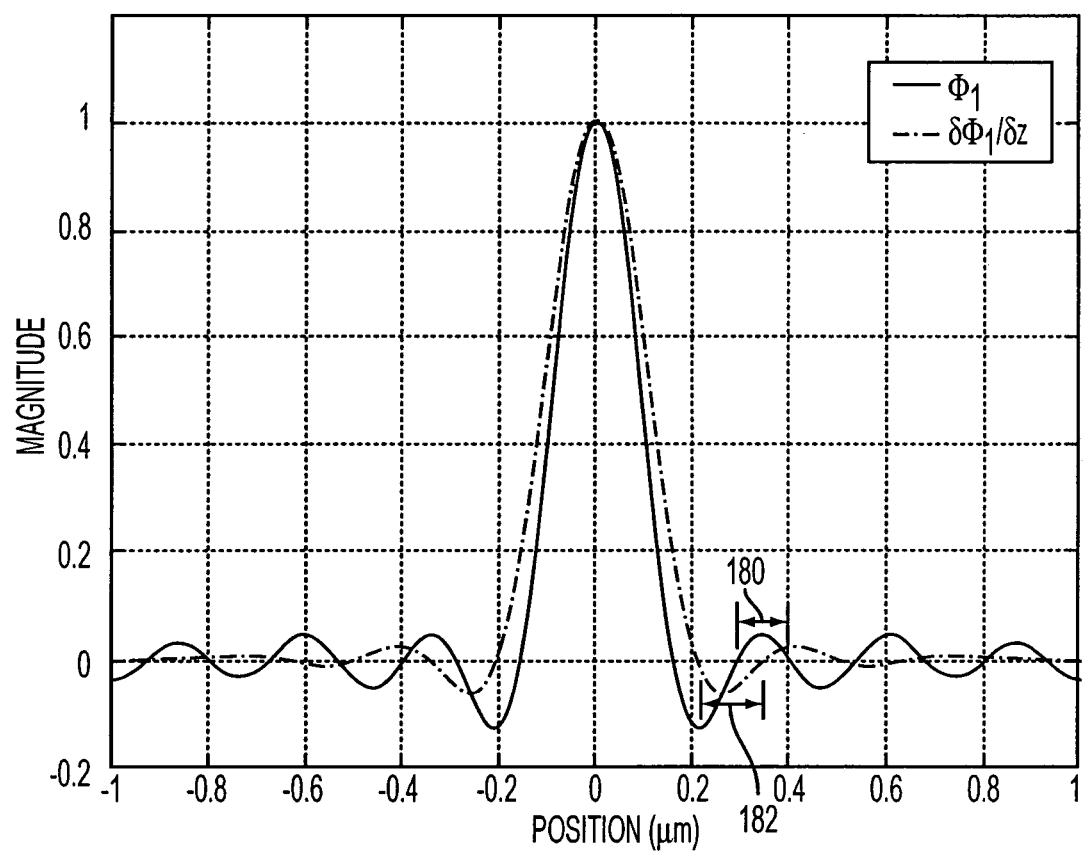
FIG. 18 graphically illustrates aerial images along the x axis for maximized exposure latitude and for maximized depth of focus.

FIG. 18 illustrates intensity distribution for a coherent light source (PSF) for maximizing EL and for maximizing DOF. As can be seen, side lobes for a maximum EL (solid line) and for a maximum DOF (dashed line) do not coincide, but do overlap. As such, optimal AF placement for maximizing EL will not maximize DOF, and vice-versa.

Figure 19A:
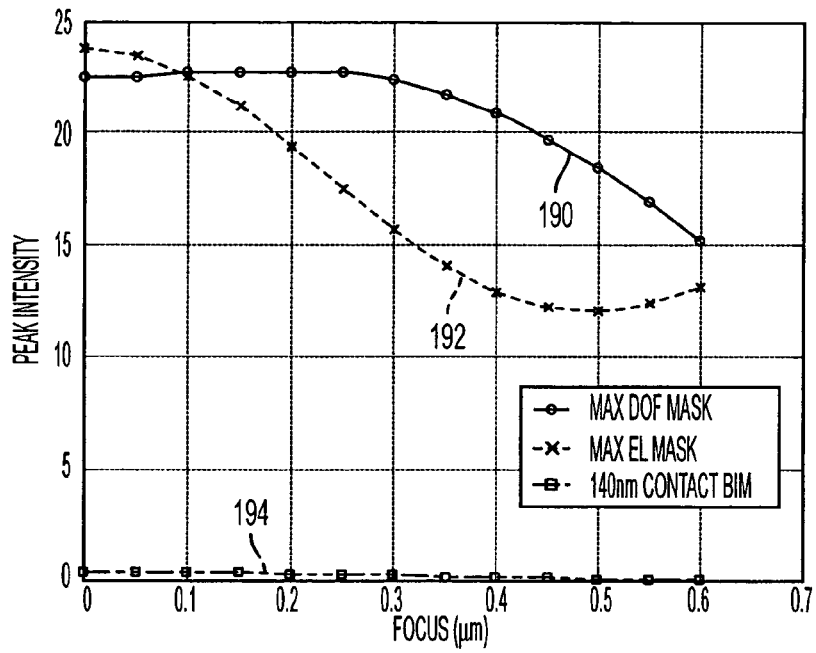
FIG. 19A graphically illustrates peak intensity through focus for a CPL mask optimized for maximizing DOF, for maximizing EL, and for a conventional mask.
Figure 19B:
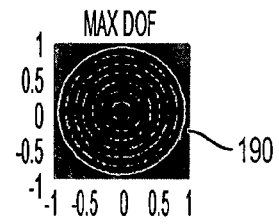
FIGS. 19B and 19C illustrate an exemplary optimized CPL mask for maximizing DOF and for maximizing EL, respectively, both of which correspond to the plot of FIG. 19A.
Figure 19C:
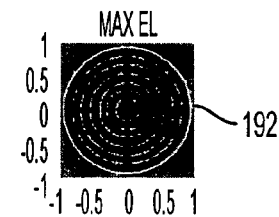

FIG. 19 illustrates a plot of peak intensity through focus for maximizing DOF, for maximizing EL utilizing CPL masks, and for a control mask of a 140 nm binary context. Superimposed on the graph is the corresponding masks for a maximum DOF and a maximum EL, and corresponds to the CPL mask described in connection with FIG. 1.

Comparing the two masks, the first phase shifted ring for the max DOF mask is closer to the center and is wider as compared to the first phase shifted ring for the max EL mask. Comparison of the peak intensities shows that the max EL mask has the highest peak intensity at 0 μm defocus. The max DOF mask, however, has smaller peak intensity at 0 μm defocus, but the peak intensity of the max DOF mask is more constant through focus as compared to the max EL mask.

Figure 20A:
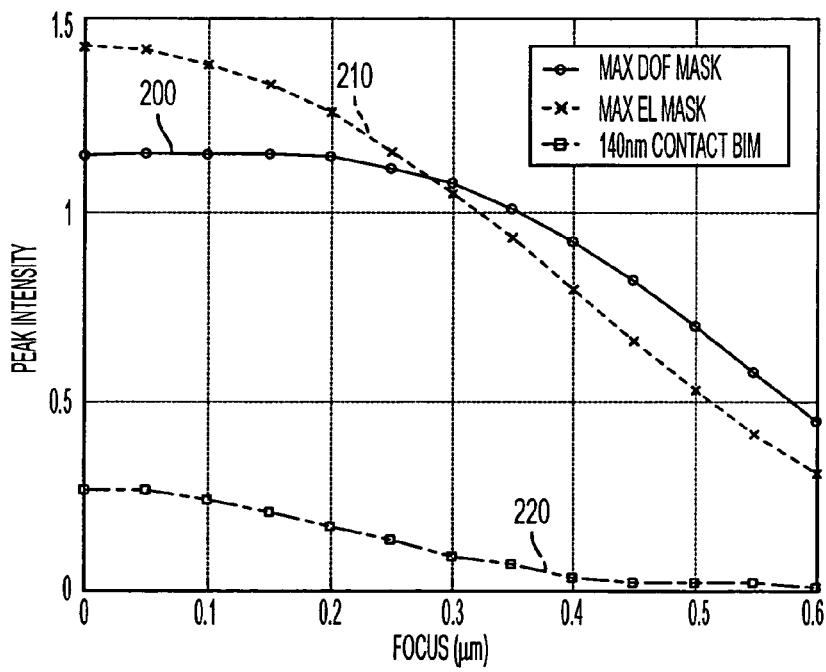
FIG. 20A graphically illustrates peak intensity through focus for a mask optimized for quasar illumination for maximizing DOF, for maximizing EL, and a conventional mask.
Figure 20B:
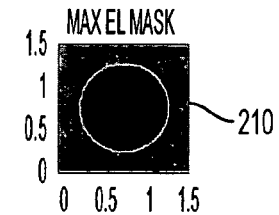
FIGS. 20B and 20C illustrate an exemplary optimized mask for quasar illumination for maximizing DOF and for maximizing EL, respectively, both of which correspond to the plot of FIG. 20A.
Figure 20C:
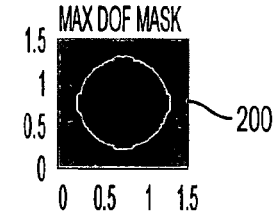

FIG. 20 illustrates maximum EL and maximum DOF masks created for Quasar illumination ($\lambda$=193 nm, NA=0.75, $\sigma_{in}$=0.72, $\sigma_{out}$=0.92, 30° span angle). The max DOF mask for Quasar illumination has a phase shifted AF that is closer to the center as compared to the phase shifted AF for the max EL mask. This phase shifted AF is also wider as compared to the max EL mask. The max EL mask has the highest peak intensity at 0 μm defocus. The max DOF mask, however, has a smaller peak intensity at 0 μm defocus, but the peak intensity of the max DOF mask is more constant through focus as compared to the max EL.

In either case (FIG. 19 or FIG. 20), a designer may choose a tradeoff between EL and DOF that is optimal for given parameters.

IML can maximize the EL and DOF of contact layers. Using the algorithm presented above, a full chip interference map can be generated, and AFs can be placed in the same amount of time required to place AFs with rule based OPC. In the future, rule based placement of AFs will be replaced with IML placement of AFs.

Although this disclosure primarily discussed optimization of contact holes, the theory of IML can be used to place AFs on all layers or used to design a CPL mask for all layers. For a dark field mask such as a trench back end mask, line functions are used instead of Dirac delta functions. For a bright field mask, Babinet's principle is used in combination to the theory discussed above. In Babinet's principle, a bright field mask is replaced with its compliment, a dark field mask. With this compliment dark field mask, AFs are placed with the theory discussed above. After placing the AFs on the compliment dark field mask, it can be converted back to a bright field mask again using Babinet's principle.

Moreover, the techniques described above can be applied to alternating PSM for contact printing in order to optimize the placement and phase of AFs. Typically for alternating PSM, phase shifted AFs are placed based on a set of rules. The methodology for using IML on alternating PSM is to first color the contact holes on the mask, i.e., apply alternating PSM to the contacts. However, Step 1 needs to be modified. Step 1 is modified by replacing all 180° phase shifted contacts with inverse of the Dirac delta function, $-\delta(x-x_i, y-y_i)$, while all unshifted contacts use the Dirac delta function, $\delta(x-x_i, y-$ $y_i$). After this modification, the other steps, 2 through 5, are used as discussed for placing 0° phase-shifted and 180° phase-shifted AFs.

In addition to alternating PSM, IML can recommend the phase of a neighboring contact. For example, when a contact is at a pitch such that the $\Phi_1$ is less then zero, this contact should be phase shifted. By phase shifting the contact based on the phase of $\Phi_1$, forbidden pitch regions can be eliminated.

Figure 21:
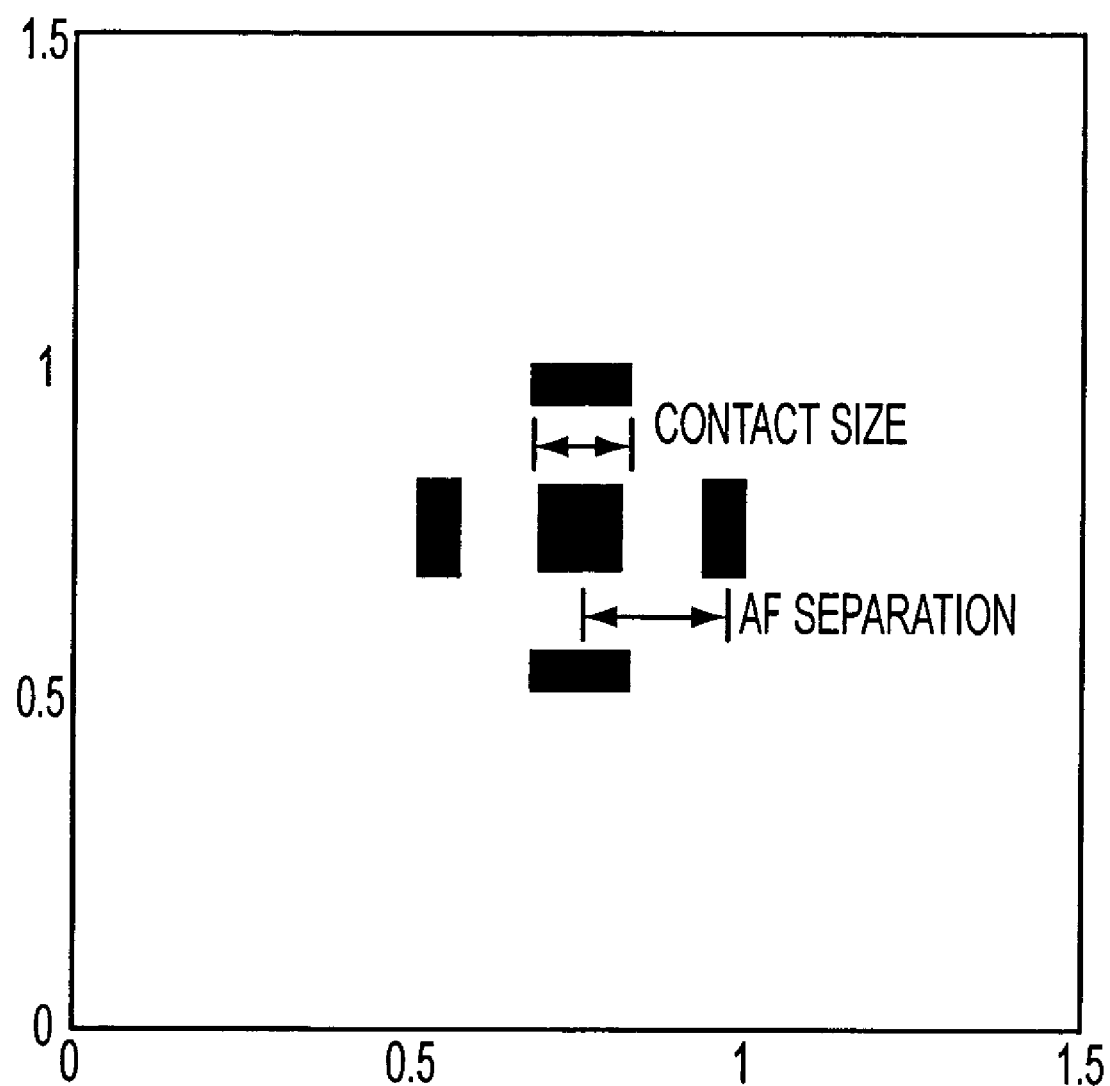
FIG. 21 illustrates a contact hole and assist features.

Discussed above, assist feature sizes are determined that maximize either EL or DOF or that meets a tradeoff between these two criteria. Assist feature separation is another factor that maximizes peak intensity. FIG. 21 illustrates AF separation, which corresponds to a midpoint of a first AF to a midpoint of a second AF.

Figure 22A:
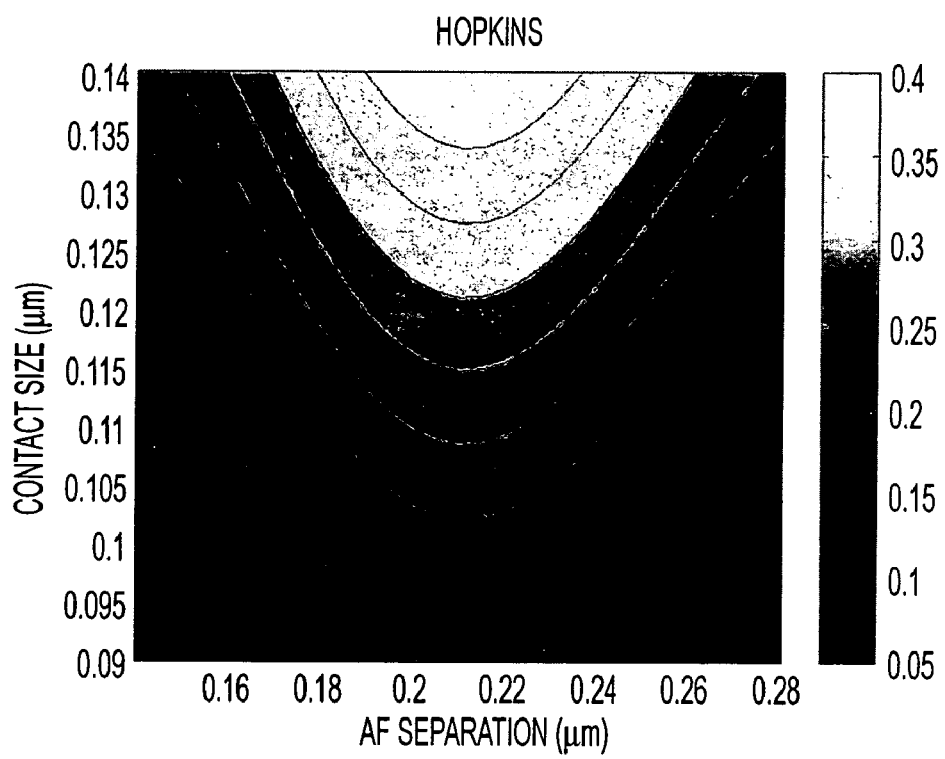
FIGS. 22(a)-(b) graphically illustrate contact size versus AF separation according to intensity determined in accordance with Hopkins and by using an eigenfunction, respectively.
Figure 22B:
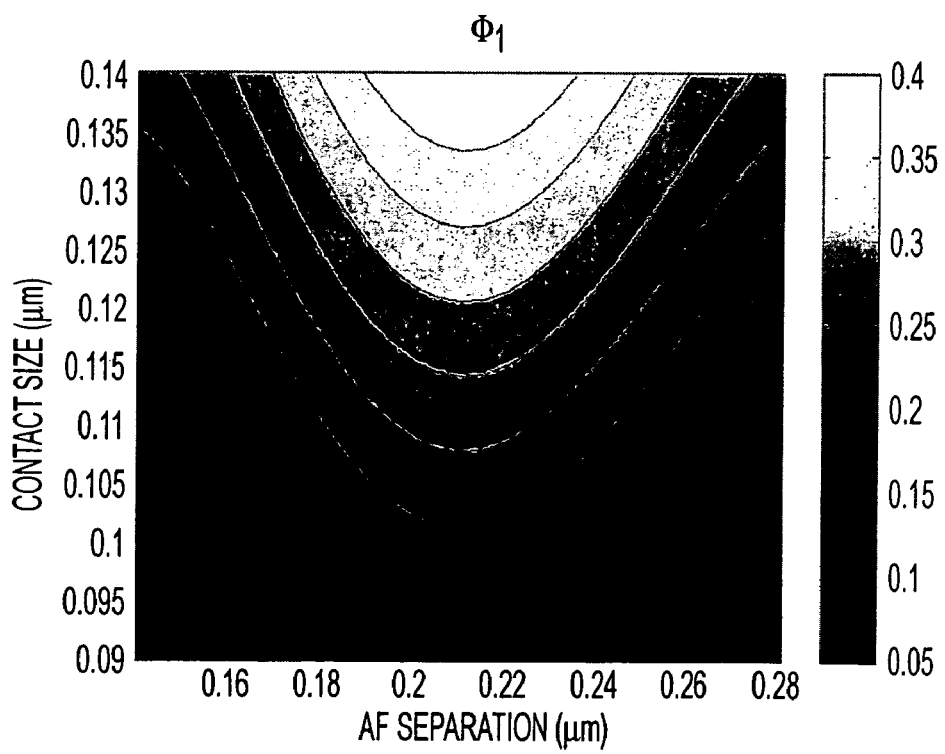
Figure 23A:
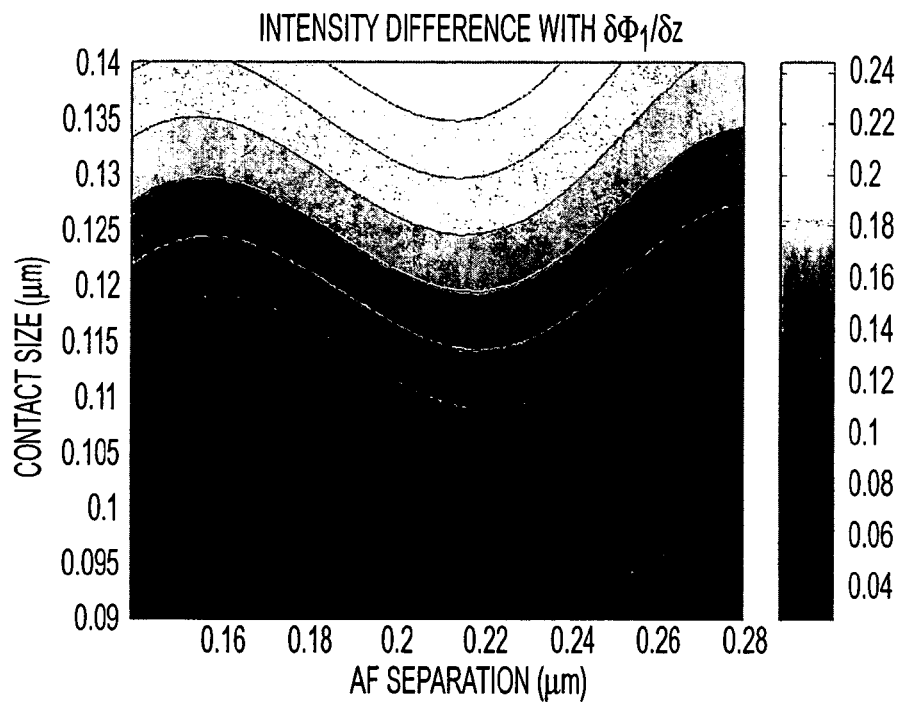
FIGS. 23(a)-(b) graphically illustrate contact size versus AF separation according to intensity difference determined in accordance with Hopkins and by using an eigenfunction, respectively.
Figure 23B:
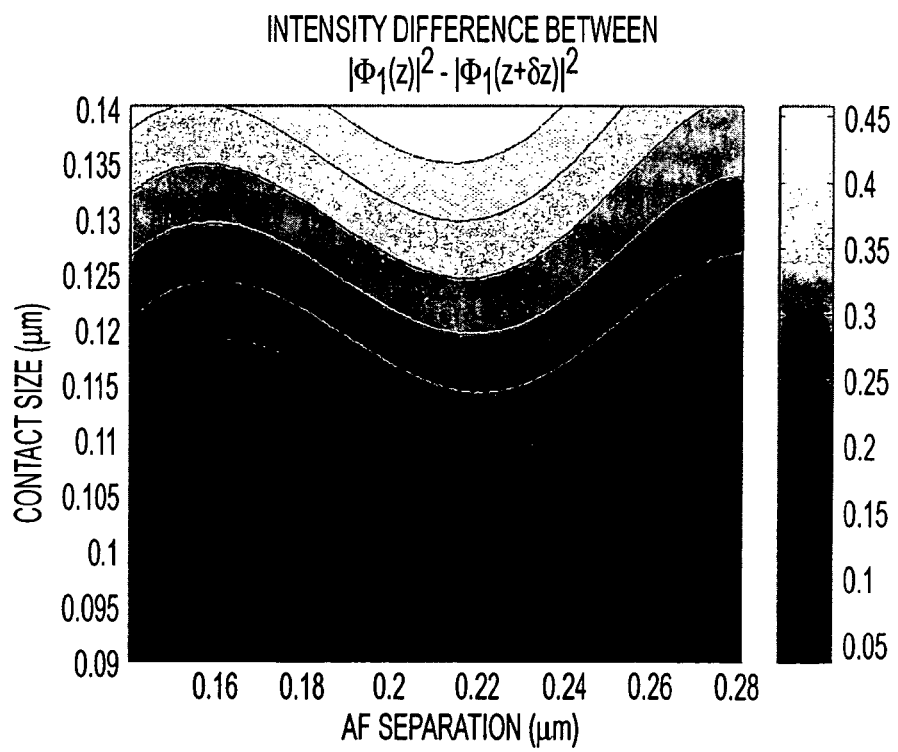
Figure 24A:
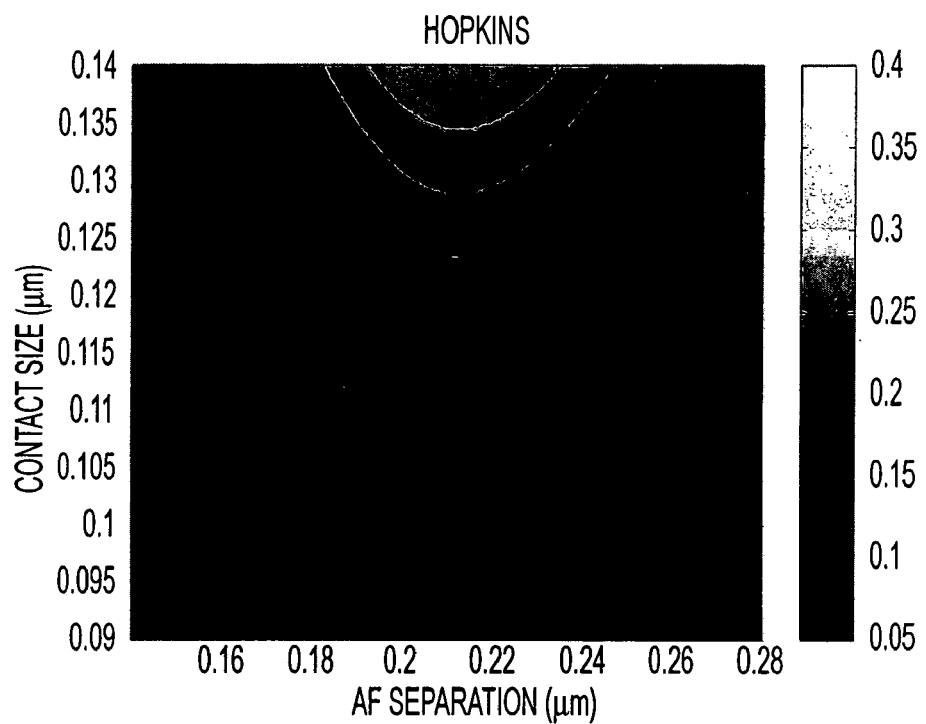
FIGS. 24(a)-(b) graphically illustrate contact size versus AF separation according to intensity determined in accordance with Hopkins and by using an eigenfunction, respectively.
Figure 24B:
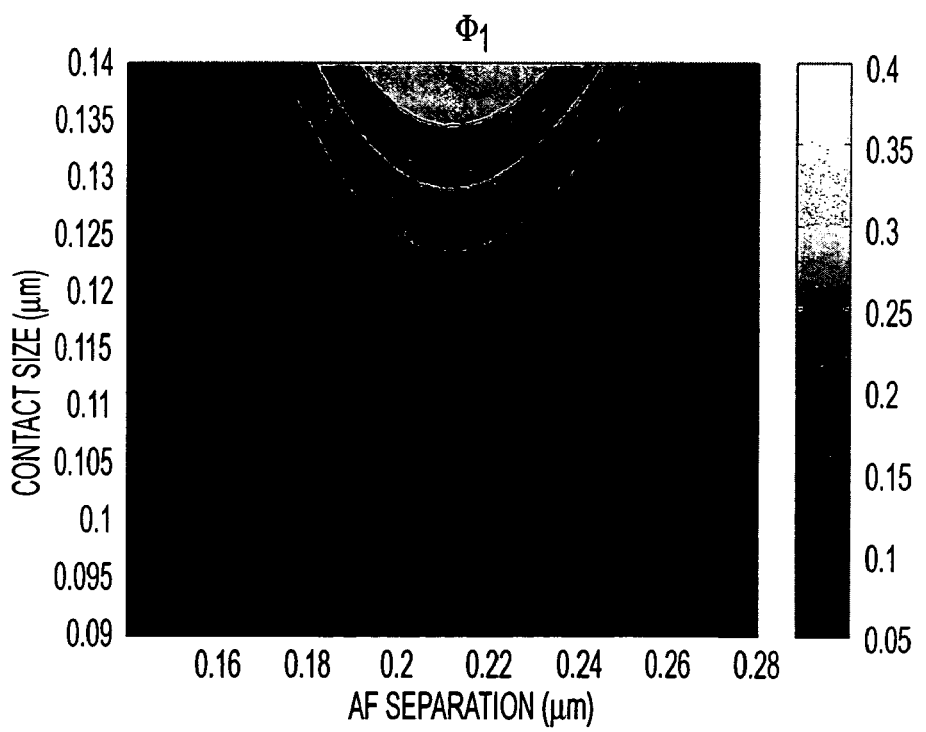
Figure 25A:
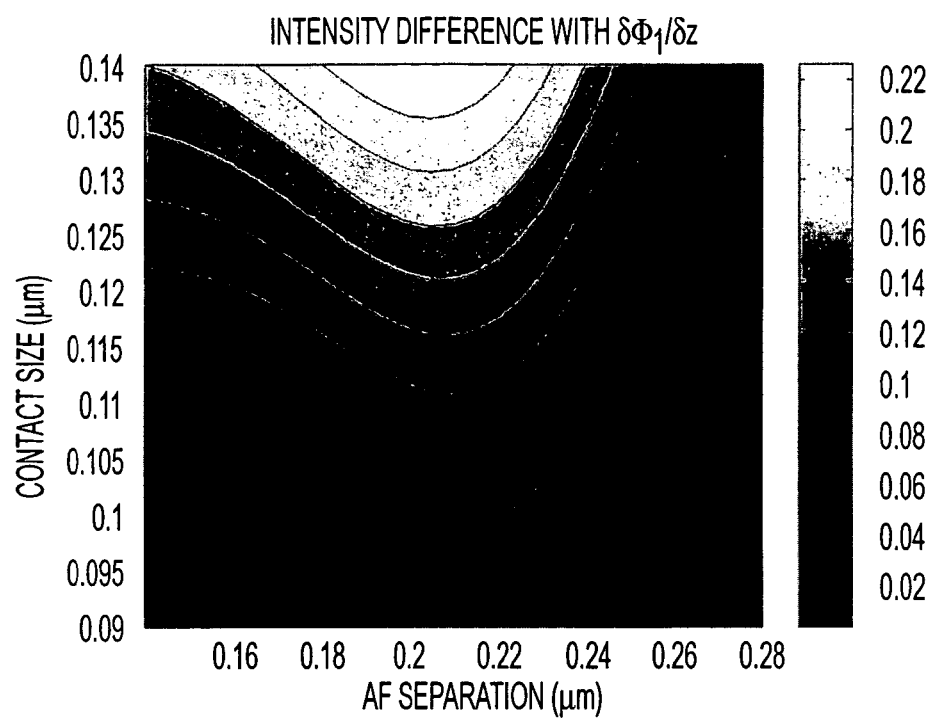
FIGS. 25(a)-(b) graphically illustrate contact size versus AF separation according to intensity difference determined in accordance with Hopkins and by using an eigenfunction, respectively.
Figure 25B:
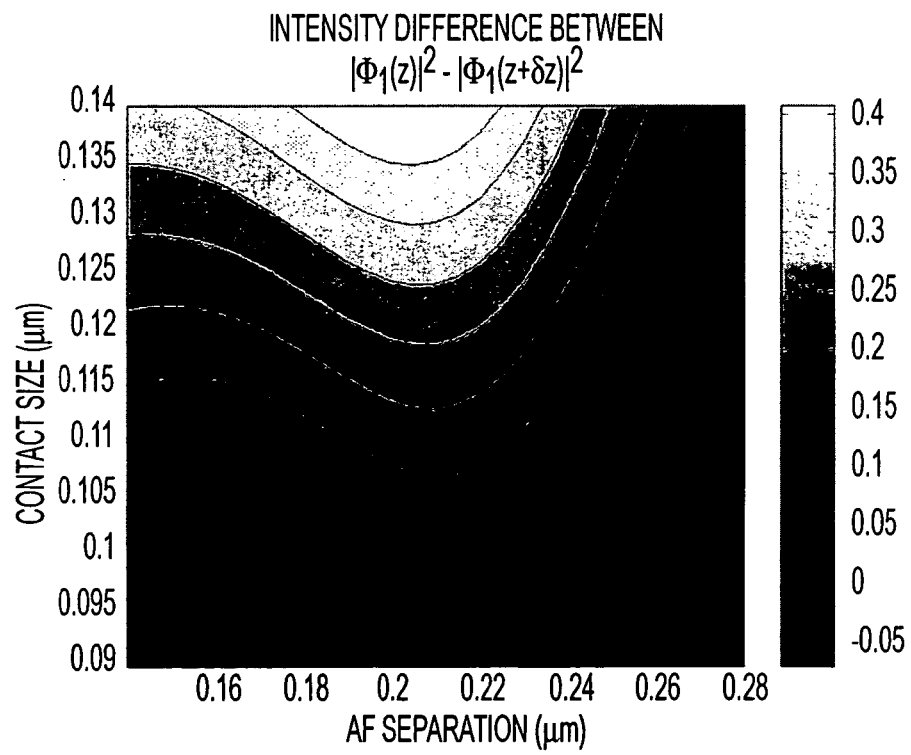

Conventionally, AF separation may be determined using Hopkins formulation. However, AF separation may be approximated based on the first eigenfunction $\Phi$ as can be seen in FIGS. 22-25. These figures illustrate a plot of AF separation versus contrat size, determined in accordance with Hopkins formulation (FIGS. 22A, 23A, 24A and 25A) and determined in accordance with the first eigenfunction (FIGS. 22B, 23B, 24B and 25B). FIGS. 22-23 illustrate maximum peak intensities determined for a binary mask, and FIGS. 24-25 illustrate maximum peak intensity for a 0% attenuated PSM mask.

Comparison with plots 22A and 22B determined in accordance with Hopkins and using the first eigenfunction for an approximation, respectively, the first eigenfunction or first kernel, $\Phi_1$, is capable of approximizing optimal AF separation for a range of contact sizes that maximize peak intensity, instead of using Hopkins formulation, for a binary mask.

In other words, comparing 22A and 22B, 23A and 23B, 24A and 24B and 25A and 25B illustrate that one eigenfunction is sufficient for accurately predicting optimal AF separation.

In the future, IML will become an integral part of optimizing various resolution enhancement techniques. A possible scenario is to first simultaneously optimize the source and the mask on the core of a memory device or on critical patterns of a logic device. Then using the optimized source for the core or critical pattern apply IML to the rest of the device (the periphery for a memory device or the non-critical patterns for a logic device). The eigenfunctions of the TCC can also be used in design for manufacture (DFM). The eigenfunctions represent a mathematical basis for designing a device. For example, regions in which the first eigenfunction, $\Phi_1$, are less zero represent the forbidden pitch ranges and should be avoided in the design. With the first eigenfunction, the designer can quickly check the robustness of a design with respect to lithography performance.

Figure 26:
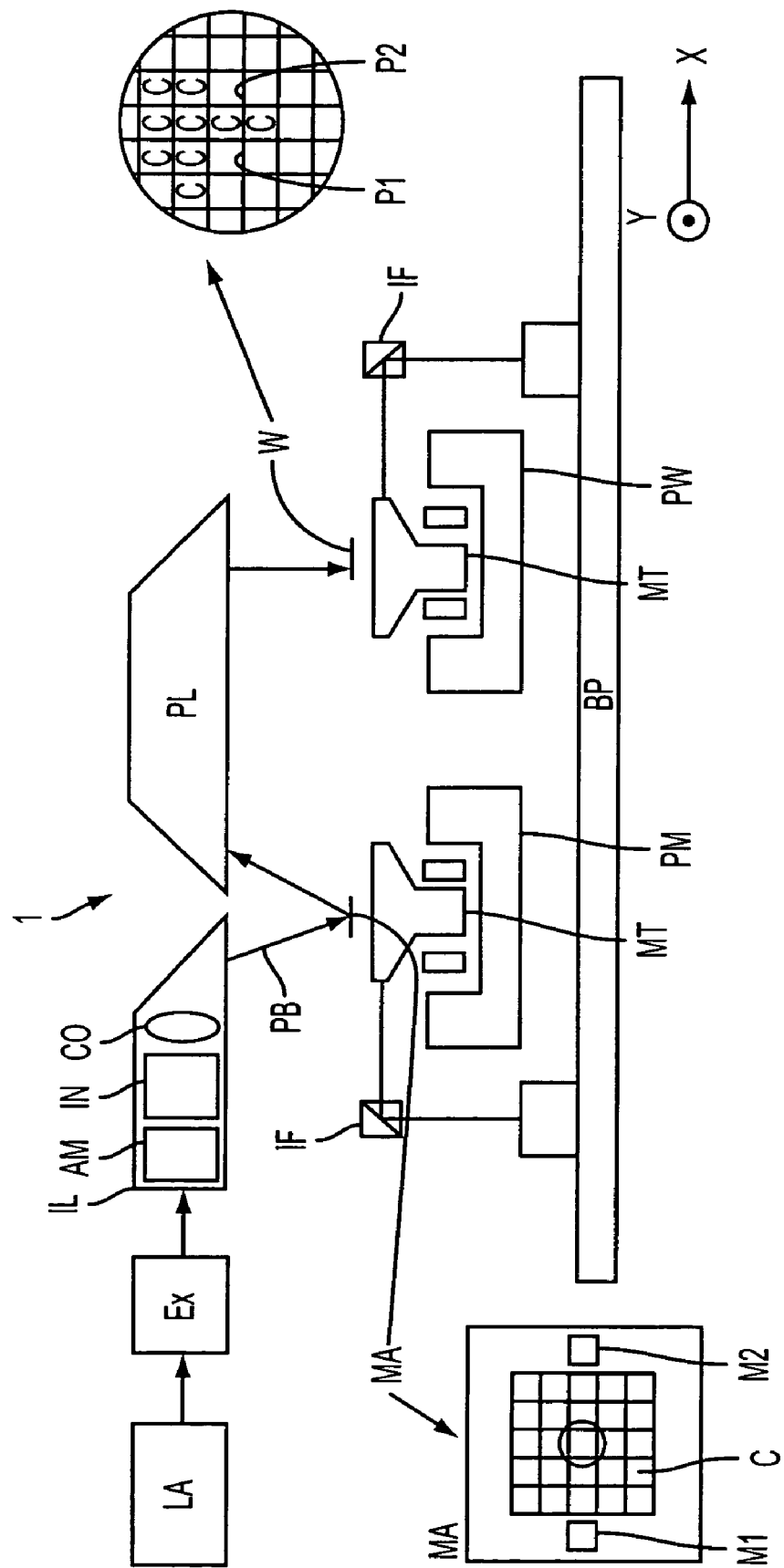
FIG. 26 schematically depicts an exemplary lithographic projection apparatus suitable for use with a mask designed with the aid of the disclosed concepts.

FIG. 26 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 26 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 26. However, in the case of a wafer stepper (as opposed to a step-and-scan tool) the mask table MT may just be connected to a short stroke actuator, or may be fixed.

The depicted tool can be used in two different modes:
- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing an illumination profile of a pattern to be formed in a surface of a substrate relative to a given mask, comprising the steps of:
   (a) mathematically representing resolvable feature(s) from the given mask including representing at least one of a square contact hole by a Dirac delta function and a rectangular contact hole by a line function;
   (b) generating an interference map representation from Step (a);
   (c) modifying the interference map representation to maximize intensity corresponding to the resolvable features;
   (d) determining assist feature size(s) such that intensity side lobes do not print; and
   (e) following step (c) minimizing the change in peak intensity with respect to focus for maximizing death of focus (DOF).

2. The method of optimizing an illumination profile according to claim 1, wherein step (c) includes modifying the interference map representation by replacing it with discrete mask transmissions such that the representation is maximized relative to the center of the resolvable feature(s).

3. The method of optimizing an illumination profile according to claim 2, wherein step (d) includes selecting discrete mask transmission such that the representation is minimized for area(s) outside of the resolvable feature(s).

4. The method of optimizing an illumination profile according to claim 1, further comprising optimizing exposure latitude in accordance with step (d).

5. The method of optimizing an illumination profile according to claim 1, wherein step (e) includes the steps of:
   (i) modifying the interference map representation by taking a partial derivative with respect to the focus; and
   (ii) selecting discrete mask transmission(s) that minimizes the partial derivative.

6. The method of optimizing an illumination profile according to claim 1, wherein step (e) includes maximizing the DOF in a range that is a factor of a critical dimension (CD) of the given mask.

7. The method of optimizing an illumination profile according to claim 6, wherein the range is three times the CD.

8. The method of optimizing an illumination profile according to claim 1, wherein step (b) includes convolving the result of step (a) with at least one eigenfunction corresponding to an illumination to create the interference map.

9. The method of optimizing an illumination profile according to claim 8, wherein the at least one eigenfunction is the first eigenfunction.

10. The method of optimizing an illumination profile according to claim 1, wherein for an alternating PSM, in step (a) replacing a 180° phase shifted contact with an inverse Dirac delta function.

11. A program product, comprising executable code stored in at least one machine readable storage device, wherein execution of the code by at least one programmable computer causes the at least one programmable computer to perform a sequence of steps for optimizing an illumination profile of a pattern to be formed in a surface of a substrate for a given mask, comprising:
 (a) mathematically representing resolvable feature(s) from the given mask including representing at least one of a square contact hole by a Dirac delta function and a rectangular contact hole by a line function;
 (b) generating an interference map representation from Step (a);
 (c) modifying the interference map representation to maximize intensity corresponding to the resolvable features;
 (d) determining assist feature size(s) such that intensity side lobes do not print; and
 (e) following step (c) minimizing the change in peak intensity with respect to focus for maximizing depth of focus (DOF).

12. The program product according to claim 11, wherein step (c) includes modifying the interference map representation by replacing it with discrete mask transmissions such that the representation is maximized relative to the center of the resolvable feature(s).

13. The program product according to claim 12, wherein step (d) includes selecting discrete mask transmission such that the representation is minimized for area(s) outside of the resolvable feature(s).

14. The program product according to claim 11, further comprising optimizing exposure latitude in accordance with step (d).

15. The program product according to claim 11, wherein step (e) includes the steps of:
 (i) modifying the interference map representation by taking a partial derivative with respect to the focus; and
 (ii) selecting discrete mask transmission(s) that minimizes the partial derivative.

16. The program product according to claim 11, wherein step (e) includes maximizing the DOF in a range that is a factor of a critical dimension (CD) of the given mask.

17. The program product according to claim 16, wherein the range is three times the CD.

18. The program product according to claim 11, wherein step (b) includes convolving the result of step (a) with at least one eigenfunction corresponding to an illumination to create the interference map.

19. The program product according to claim 16, wherein the at least one eigenfunction is the first eigenfunction.

20. The program product according to claim 11, wherein for an alternating PSM, in step (a) replacing a 180° phase shifted contact with an inverse Dirac delta function.

21. A method of designing an optimal mask, comprising the steps of:
 (a) generating an illumination profile of a pattern to be formed in a surface of a substrate relative to a given mask;
 (b) mathematically representing resolvable feature(s) from the given mask including representing at least one of a square contact hole by a Dirac delta function and a rectangular contact hole by a line function;
 (c) generating an interference map representation from Step (b);
 (d) modifying the interference map representation to maximize intensity corresponding to the resolvable features;
 (e) determining assist feature size(s) such that intensity side lobes do not print;
 (f) creating the optimal mask by placing assist features of respective size(s) from step (e) on the mask; and
 (g) following step (d) minimizing the change in peak intensity with respect to focus for maximizing depth of focus (DOF).

22. The method of optimizing an illumination profile according to claim 21, wherein step (c) includes modifying the interference map representation by replacing it with discrete mask transmissions such that the representation is maximized relative to the center of the resolvable feature(s).

23. The method of optimizing an illumination profile according to claim 22, wherein step (e) includes selecting discrete mask transmission such that the representation is minimized for area(s) outside of the resolvable feature(s).

24. The method of optimizing an illumination profile according to claim 21, further comprising optimizing exposure latitude in accordance with step (e).

25. The method of optimizing an illumination profile according to claim 21, wherein step (g) includes the steps of:
 (i) modifying the interference map representation by taking a partial derivative with respect to the focus; and
 (ii) selecting discrete mask transmission(s) that minimizes the partial derivative.

26. The method of optimizing an illumination profile according to claim 21, wherein step (g) includes maximizing the DOF in a range that is a factor of a critical dimension (CD) of the given mask.

27. The method of optimizing an illumination profile according to claim 26, wherein the range is three times the CD.

28. The method of optimizing an illumination profile according to claim 21, wherein step (c) includes convolving the result of step (a) with at least one eigenfunction corresponding to an illumination to create the interference map.

29. The method of optimizing an illumination profile according to claim 28, wherein the at least one eigenfunction is the first eigenfunction.

30. The method of optimizing an illumination profile according to claim 21, wherein For an alternating PSM, in step (a) replacing a 180° phase shifted contact with an inverse Dirac delta function.

* * * * *